(12) United States Patent
Chang

(10) Patent No.: US 10,256,258 B2
(45) Date of Patent: Apr. 9, 2019

(54) PIXEL STRUCTURE AND FABRICATION METHOD THEREOF

(71) Applicant: AU OPTRONICS CORPORATION, Hsin-chu (TW)

(72) Inventor: Chi-Ho Chang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/890,665

(22) Filed: Feb. 7, 2018

(65) Prior Publication Data

US 2018/0166466 A1 Jun. 14, 2018

Related U.S. Application Data

(62) Division of application No. 15/275,564, filed on Sep. 26, 2016, now Pat. No. 9,941,305.

(30) Foreign Application Priority Data

Mar. 14, 2016 (TW) .............................. 105107720 A

(51) Int. Cl.
| | |
|---|---|
| *H01L 21/768* | (2006.01) |
| *H01L 27/12* | (2006.01) |
| *H01L 23/535* | (2006.01) |
| *H01L 29/786* | (2006.01) |
| *H01L 29/66* | (2006.01) |
| *H01L 29/417* | (2006.01) |

(52) U.S. Cl.
CPC ...... *H01L 27/124* (2013.01); *H01L 21/76895* (2013.01); *H01L 23/535* (2013.01); *H01L 27/1225* (2013.01); *H01L 27/1248* (2013.01); *H01L 27/1259* (2013.01); *H01L 29/41733* (2013.01); *H01L 29/66742* (2013.01); *H01L 29/66765* (2013.01); *H01L 29/66969* (2013.01); *H01L 29/78618* (2013.01); *H01L 29/78696* (2013.01)

(58) Field of Classification Search
CPC ............. H01L 27/124; H01L 29/78618; H01L 23/535; H01L 21/76895; H01L 29/66742; H01L 27/1259; H01L 23/52
USPC .......................................................... 257/72
See application file for complete search history.

(56) References Cited

U.S. PATENT DOCUMENTS

2007/0236625 A1* 10/2007 Wang .................... G02F 1/1343
349/54

* cited by examiner

*Primary Examiner* — Caleen O Sullivan
(74) *Attorney, Agent, or Firm* — Tim Tingkang Xia, Esq.; Locke Lord LLP

(57) ABSTRACT

A pixel structure and a fabrication method thereof are provided, and the fabrication method includes steps as follows. A gate and a scan line connected to the gate electrode are formed on a substrate. An insulation layer is formed on the substrate and is patterned to form an opening corresponding to the gate electrode. A gate insulation layer is formed to cover the gate electrode and the scan line. A channel layer is formed on the gate insulation layer and is located in the opening. A first ohmic contact layer and a second ohmic contact layer are formed on the channel layer and are located in the opening. A source electrode, a drain electrode and a data line connected to the source electrode are formed on the first ohmic contact layer and the second ohmic contact layer. A first electrode is formed and is electrically connected to the drain electrode.

6 Claims, 24 Drawing Sheets

PIXEL STRUCTURE AND FABRICATION METHOD THEREOF

CROSS-REFERENCE TO RELATED APPLICATION

This application is a divisional application of U.S. patent application Ser. No. 15/275,564, filed on Sep. 26, 2016, now pending, which claims priority to and benefit of, under 35 U.S.C. § 119(a), Patent Application No. 105107720 filed in Taiwan R.O.C. on Mar. 14, 2016, which are hereby incorporated by reference in their entireties.

BACKGROUND

Technical Field

The present invention relates to a pixel structure and a fabrication method thereof, and in particular, to a pixel structure having a relatively low gate-drain parasitic capacitance and a low gate-source parasitic capacitance and a fabrication method thereof.

Related Art

With advances in the modern technologies, displays of various specifications have been widely applied to screens of electronic products for consumers, for example, mobile phones, notebook computers, digital cameras, Personal Digital Assistants (PDA), etc. Among the displays, liquid crystal displays (LCD) and organic electro-luminescent displays (OELD or OLED) become mainstream commodities in the market due to the advantages of being light and thin and having a low power consumption.

The process for manufacturing the LCDs and the OLEDs includes arranging an array of semiconductor elements on a substrate, and the semiconductor element includes a thin film transistor (TFT). Along with an increase in the degree of resolutions of the LCDs and the OLEDs, a proportion occupied by thin film transistors in a unit area also increases. Further, because there are overlapped regions between a gate electrode and a source electrode and between the gate electrode and a drain electrode of the thin film transistor, a ratio of a gate electrode-drain electrode parasitic capacitance and a gate electrode-source electrode parasitic capacitance (that is, Cgd and Cgs) of the thin film transistor to a storage capacitance also increases accordingly. Therefore, generally a large Resistance-Capacitance loading (RC loading) may be generated in transmission of signals when the thin film transistor is used as a transistor in a driving circuit, thereby leading to the reduction in the display quality of a display.

SUMMARY

The present invention provides a pixel structure and a fabrication method thereof, capable of avoiding the problem of reduction in the display quality of a display caused by phenomena such as a high gate electrode-drain electrode parasitic capacitance and a high gate electrode-source electrode parasitic capacitance.

The present invention provides a pixel structure. The pixel structure comprises a scan line, a data line, a gate electrode, an insulation layer, a gate insulation layer, a channel layer, a first ohmic contact layer, a second ohmic contact layer, a source electrode, a drain electrode, and a first electrode. The scan line and the data line are disposed on a substrate in an interlaced manner. The gate electrode is located on the substrate and is electrically connected to the scan line. The insulation layer is located on the gate electrode and is provided with an opening disposed opposite to the gate electrode. The gate insulation layer is located on the gate electrode. The channel layer is located on the gate insulation layer, and the channel layer is located in the opening. The first ohmic contact layer and the second ohmic contact layer are located on the channel layer and are disposed in the opening. The source is located on the first ohmic contact layer, where the source is electrically connected to the data line. The drain is located on the second ohmic contact layer. The first electrode is located on the insulation layer and is electrically connected to the drain.

The present invention further provides a fabrication method for a pixel structure. The fabrication method includes the following steps. A gate electrode and a scan line connected to the gate electrode are formed on a substrate. An insulation layer is formed on the substrate and is patterned to form an opening corresponding to the gate electrode. A gate insulation layer is formed to cover the gate electrode and the scan line. A channel layer is formed on the gate insulation layer and is located in the opening of the insulation layer. A first ohmic contact layer and a second ohmic contact layer are formed on the channel layer and are located in the opening of the insulation layer. A source electrode, a drain electrode and a data line connected to the source electrode are formed on the first ohmic contact layer and the second ohmic contact layer. A first electrode is formed and is electrically connected to the drain electrode.

On the basis of the above, an insulation layer is configured between a gate electrode and a source electrode as well as a data line electrically connected to the source electrode and between a gate electrode and a drain electrode as well as a first electrode electrically connected to the drain electrode. Therefore, a distance between the gate electrode and the source electrode as well as the data line electrically connected to the source electrode and a distance between the gate and the drain electrode as well as the first electrode electrically connected to the drain electrode can be increased, so that a gate electrode-drain electrode parasitic capacitance Cgd and a gate electrode-source electrode parasitic capacitance Cgs reduce, such that the RC loading (RC loading) can be decreased to guarantee the display quality of a display.

To make the foregoing features and advantages of the present invention more obvious and easier to understand, details are described in detail below with embodiments in combination with accompanying drawings.

BRIEF DESCRIPTION OF THE DRAWINGS

FIG. 1A to FIG. 6A are top views of a process of a fabrication method for a pixel structure according to an embodiment of the present invention;

FIG. 9A to FIG. 13A are top views of a process of a fabrication method for a pixel structure according to another embodiment of the present invention;

FIG. 9B to FIG. 13B are cross-section diagrams of the process of the fabrication method for a pixel structure in FIG. 9A to FIG. 13A along a section line AA';

FIG. 16A to FIG. 22A are top views of a process of a fabrication method for a pixel structure according to an embodiment of the present invention;

DETAILED DESCRIPTION

Figure 1A:
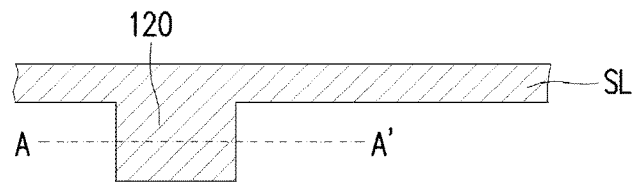
Figure 1B:
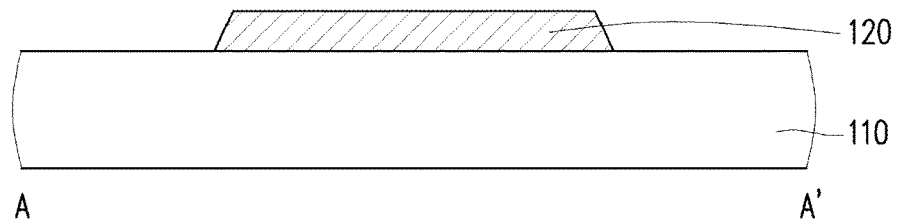
FIG. 1B, FIG. 2B, FIG. 3B, FIG. 3C, FIG. 4B, FIG. 5B, and FIG. 6B are cross-section diagrams of the process of the fabrication method for a pixel structure in FIG. 1A to FIG. 6A along a section line AA'.

FIG. 1A to FIG. 6A are top views of a process of a fabrication method for a pixel structure according to an embodiment of the present invention. FIG. 1B, FIG. 2B, FIG. 3B, FIG. 3C, FIG. 4B, FIG. 5B, and FIG. 6B respectively are cross-section diagrams of the process of the fabrication method for a pixel structure in FIG. 1A to FIG. 6A along a section line AA'. Referring to FIG. 1A and FIG. 1B, a substrate 110 is provided. The material of the substrate 110 may be glass, quartz, organic polymer, or opaque/reflective material (for example, conductive material, metal, wafer, ceramics, or other suitable materials), or other suitable materials. A gate electrode 120 and a scan line SL connected to the gate electrode 120 are formed on the substrate 110. In this embodiment, the fabrication method for the gate electrode 120 and the scan line SL includes, for example, depositing a metallic material layer (not shown) and performing a patterning process on the metallic material layer to form the gate electrode 120 and the scan line SL. The patterning process includes, for example, a photolithography and etching process, but the present invention is not limited herein. The material of the gate electrode 120 and the scan line SL includes, for example, metal, metallic oxide, organic conductive material, or a combination of the above.

Figure 2A:
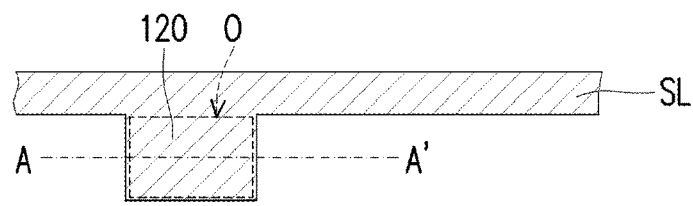
Figure 2B:
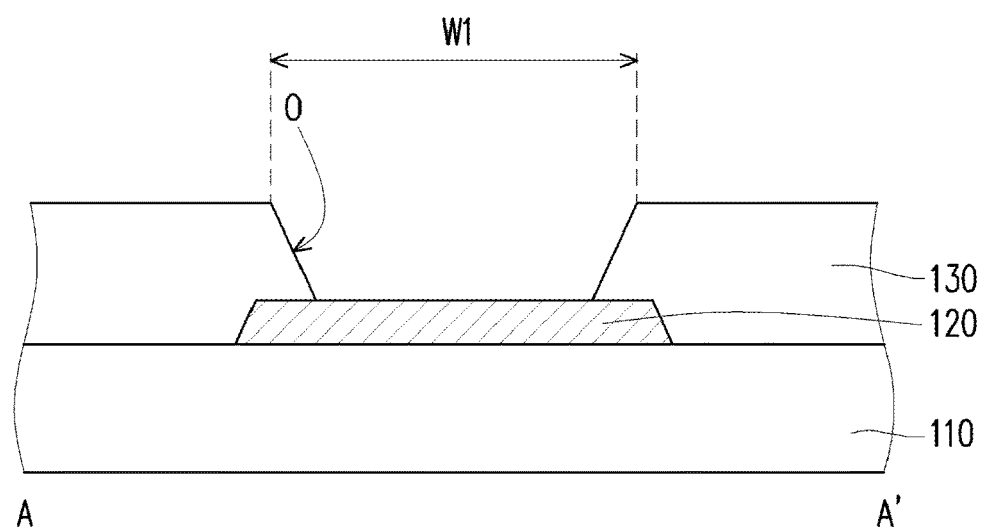

Referring to FIG. 2A and FIG. 2B, an insulation layer 130 is formed on the substrate 110. The thickness of the insulation layer 130 is approximately in a range between 1 μm and 4 μm, but the present invention is limited herein. In this embodiment, the insulation layer 130 is formed by directly depositing an insulation material layer (not shown) on the electrode 120, for example. The material of the insulation layer 130 may be, for example, an inorganic material such as polyester (PET), polyalfaolefine, polyacrylamide, polycarbonate, poly(phenyleneoxide), polypropylene, polyether, polyketone, polyol, polyacetal, an organic material such as siloxane, other suitable materials, or a combination above. Subsequently, the insulation layer 130 is patterned through a patterning process to expose an opening O of the gate electrode 120. The opening O has a width W1 along the extension direction of the scan line SL. The width W1 is approximately in a range between 5 μm and 15 μm, but the present invention is not limited herein. The patterning process includes, for example, a photolithography and etching process, but the present invention is not limited herein.

Figure 3A:
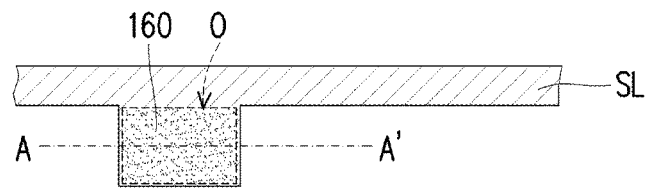
Figure 3B:
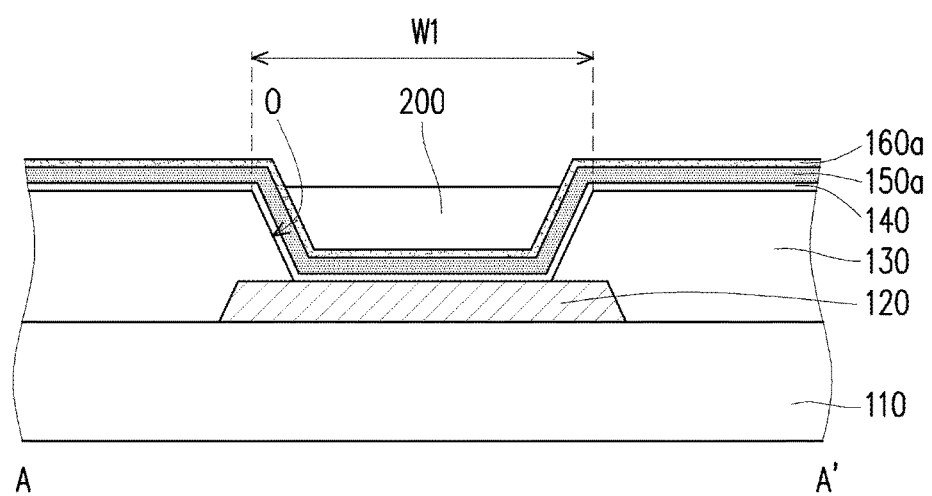
Figure 3C:
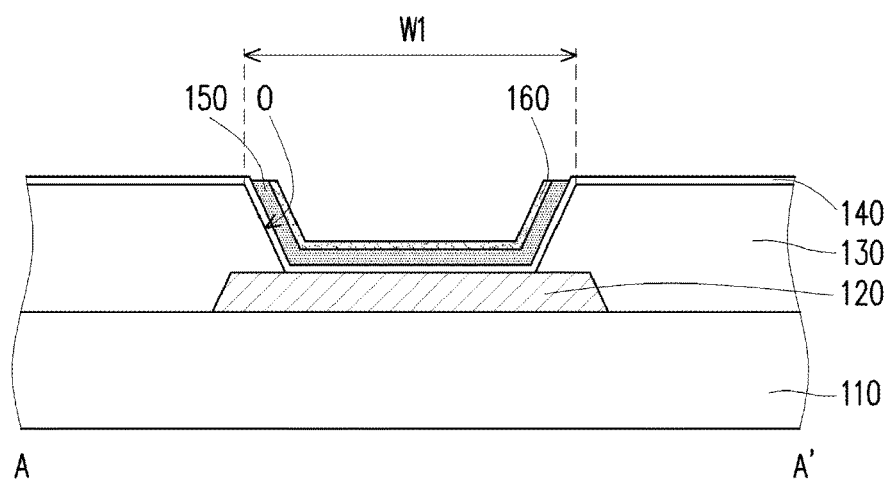

Referring to FIG. 3A, FIG. 3B, and FIG. 3C, a gate insulation layer 140 is formed on the substrate 110 to cover the gate electrode 120, the scan line SL, the insulation layer 130, and the opening O. In this embodiment, the material of the gate insulation layer 140 includes an inorganic material (for example, silicon oxide, silicon nitride, silicon oxynitride, other suitable materials, or a stack layer of at least two of the above materials), an organic material, other suitable materials, or a combination of the above. Subsequently, as shown in FIG. 3B, a method for forming a channel layer 150 and an ohmic contact layer 160 includes, for example, first sequentially depositing a channel material layer 150a and an ohmic contact material layer 160a on the gate insulation layer 140, so that the channel material layer 150a and the ohmic contact material layer 160a accordingly cover the insulation layer 130 and the opening O. Subsequently, a photoresist material is coated on the substrate 110. Through a concave profile of the opening O, the thickness of the photoresist material at a region of the substrate 110 provided with the opening O is greater than the thickness of the photoresist material at another region of the substrate 110. Further through methods such as plasma treatment and ashing treatment, some photoresist material on the substrate 110 is removed, so that only the region of the substrate 110 provided with the opening O has the photoresist material, so as to form a patterned photoresist layer 200. Subsequently, the channel material layer 150a and the ohmic contact material layer 160a are patterned by using the patterned photoresist layer 200 as a mask, to form a channel layer 150 and an ohmic contact layer 160 located in the opening O. The channel layer 150 and the ohmic contact layer 160 have the same pattern. Finally, as shown in FIG. 3C, the patterned photoresist layer 200 is removed, and the channel layer 150 and the ohmic contact layer 160 are sequentially formed on the gate insulation layer 140. It should be noted that, in this embodiment, by means of the configuration of the concave profile of the opening O, the precision of the patterning process can be guaranteed by using self-align properties, to further reduce costs of a photomask process, but the present invention is not limited herein. In an embodiment, a patterning process (for example, a photolithography and etching process) may also be used to pattern the channel material layer 150a and the ohmic contact material layer 160a, to form the channel layer 150 and ohmic contact layer 160 that have the same pattern and are located in the opening O.

In addition, in another embodiment, for example, first a channel material layer (not shown) is deposited and is then patterned to form the channel layer 150. Subsequently, an ohmic contact material layer (not shown) is deposited and is then patterned to form the ohmic contact layer 160. The two patterning processes are a photolithography and etching process and a self-align patterning process, respectively. On this basis, the channel layer 150 and the ohmic contact layer 160 may have different patterns by means of different patterning processes. The present invention does not specifically define whether the channel layer 150 and the ohmic contact layer 160 have the same pattern.

The channel layer 150 may be made of a metallic oxide semiconductor material, polycrystalline silicon, amorphous silicon, or other suitable semiconductor materials. The metallic oxide semiconductor material may be, for example, indium-gallium-zinc oxide (IGZO), zinc oxide (ZnO), stannic oxide (SnO), indium-zinc oxide (IZO), gallium-zinc oxide (GZO), zinc-tin oxide (ZTO), or indium-tin oxide (ITO). The material of the ohmic contact material layer 160 may be a dopant-contained metallic oxide semiconductor material, dopant-contained polycrystalline silicon, dopant-contained amorphous silicon, other suitable dopant-contained semiconductor materials, other suitable materials, or a combination of the above. In addition, the material of the patterned photoresist layer 200 may be, for example, a p-resistor or an n-resistor, but the present invention is not limited herein.

Figure 4A:
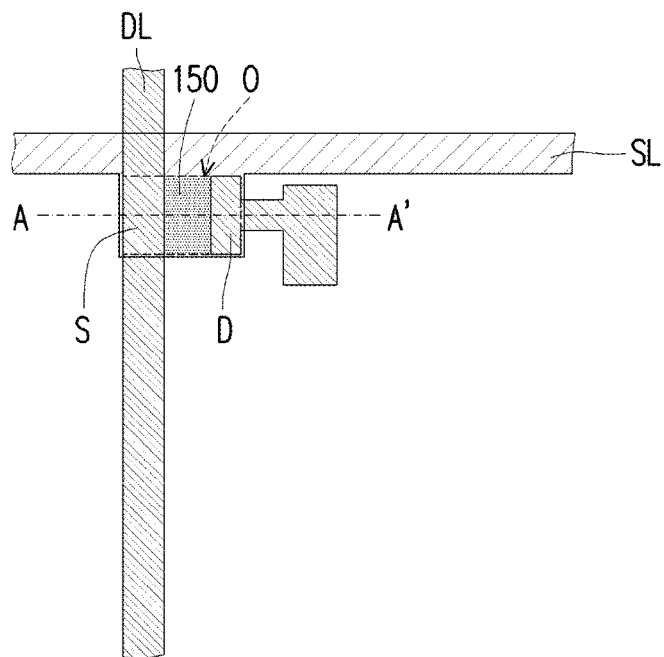
Figure 4B:
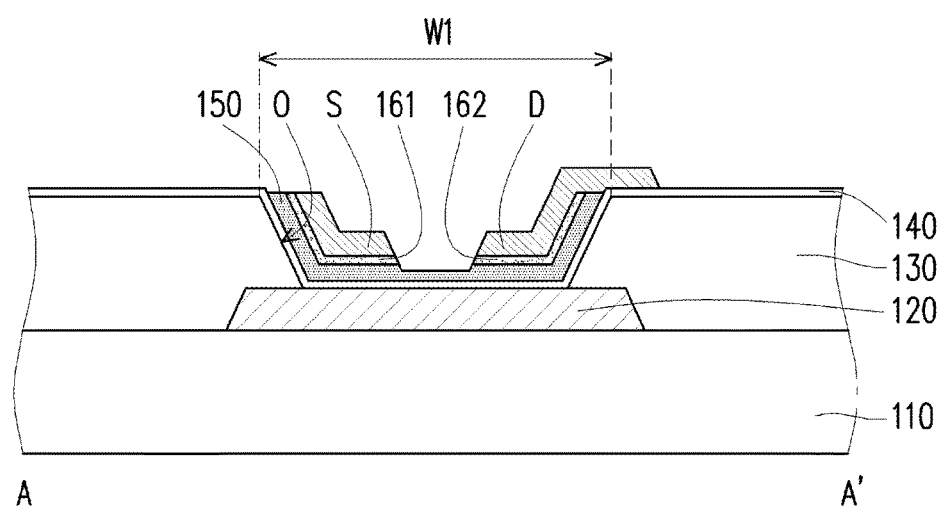

Referring to FIG. 4A and FIG. 4B, a source electrode S, a drain electrode D, and a data line DL connected to the source electrode S are formed on the substrate 110. The source electrode S and the drain electrode D are formed in the opening O. The method for forming a source electrode S, a drain electrode D, and a data line DL includes, for example, first forming a conductive material layer (not shown) and patterning the conductive material layer to form a source electrode S, a drain electrode D, and a data line DL. For example, the patterning process is performed through photolithography and etching, but the present invention is not limited herein. In consideration of conductive properties, the material of the source electrode S, the drain electrode D, and the data line DL may be, for example, metal, but the present invention is not limited herein. In this embodiment, the source electrode S may be in a shape of I-type, for example, but the present invention is not limited herein, and in other embodiments, the source electrode S may also be in a shape of a U-type or an L-type. Further, in the patterning step during forming of the source electrode S, the drain electrode D, and the data line DL, the ohmic contact layer 160 may be further patterned simultaneously to form a first ohmic contact layer 161 in contact with the source electrode S and a second ohmic contact layer 162 in contact with the drain electrode D, and the channel layer 150 is exposed out of both the first ohmic contact layer 161 and the second ohmic contact layer 162. In other words, the first ohmic contact layer 161 and the second ohmic contact layer 162 are formed on the channel layer 150 and located in the opening O, and the source electrode S, the drain electrode D, and the data line DL are located on the first ohmic contact layer 161 and the second ohmic contact layer 162, where the source electrode S and a part of the drain electrode D are formed in the opening O, and the data line DL and a part of the drain electrode D are located out of the opening O, as shown in FIG. 4A and FIG. 4B. That is, the first ohmic contact layer 161 is located between the channel layer 150 and the source electrode S, and the second ohmic contact layer 162 is located between the channel layer 150 and the drain electrode D.

In addition, in the opening O, the first ohmic contact layer 161 and the source electrode S have the same pattern, and the second ohmic contact layer 162 and the drain electrode D have the same pattern, but the present invention is not limited herein. In this embodiment, in the patterning step during forming of the source electrode S, the drain electrode D, and the data line DL, in addition to simultaneously patterning the ohmic contact layer 160 to form the first ohmic contact layer 161 and the second ohmic contact layer 162, the channel layer 150 is further patterned to remove a part of the channel layer 150 that is exposed out of the first ohmic contact layer 161 and the second ohmic contact layer 162, as shown in FIG. 4B, but the present invention is not limited herein. In other embodiments, the channel layer 150 may also be exposed but is not patterned when the ohmic contact material layer 160 is patterned to form the first ohmic contact layer 161 and the second ohmic contact layer 162. So far, the thin film transistor 100a of this embodiment is formed.

Figure 5A:
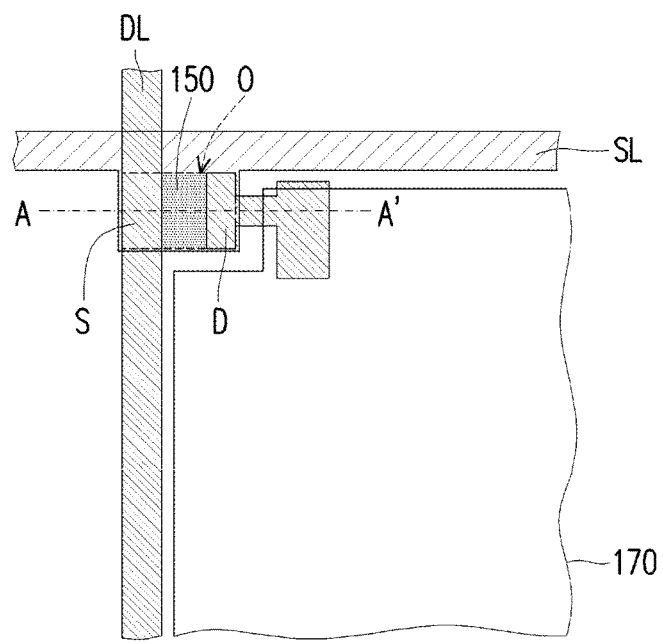
Figure 5B:
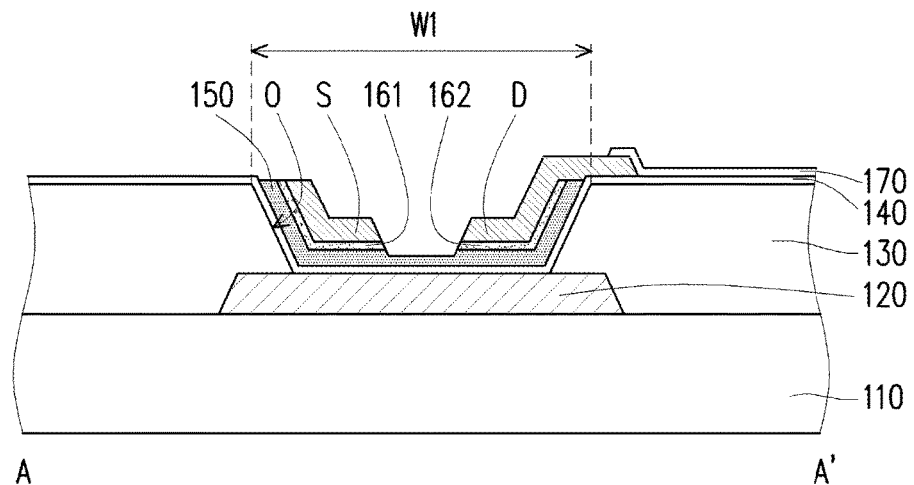

Referring to FIG. 5A and FIG. 5B, a first electrode 170 is formed on the thin film transistor 100a. The first electrode 170 is electrically connected to the drain electrode D. The first electrode 170 may be a transmissive pixel electrode, a reflective pixel electrode, or a semi-transmissive and semi-reflective pixel electrode. The material of the transmissive pixel electrode includes a metallic oxide, for example, indium-tin oxide, indium-zinc oxide, aluminum-tin oxide, aluminum-zinc oxide, indium-germanium-zinc oxide, other suitable oxides, or a stack layer of at least two of the above oxides. The material of the reflective pixel electrode includes a metallic material having a high reflectance. Up to this step, the pixel structure 10a of this embodiment is finished.

Figure 6A:
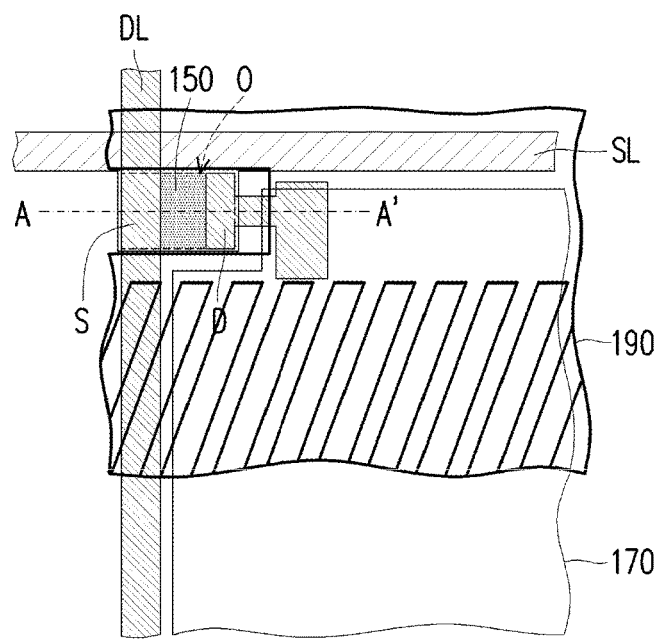
Figure 6B:
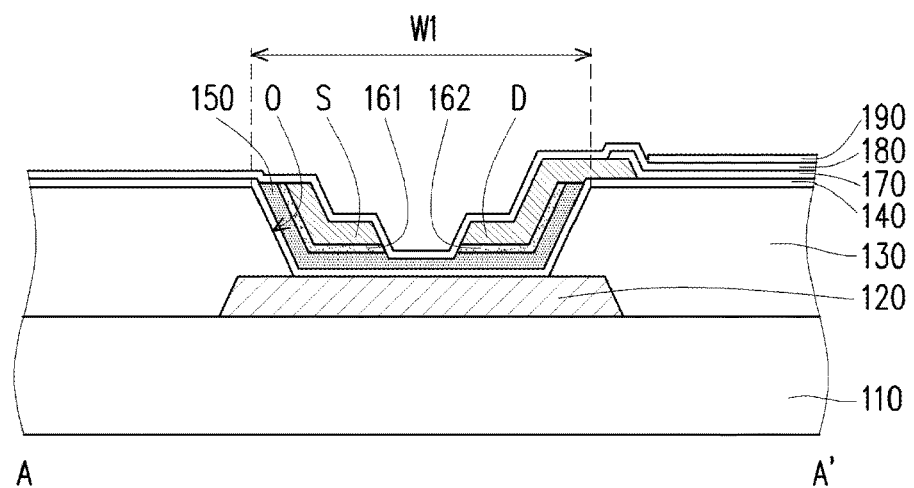

It should be noted that, when the pixel structure of the present invention is applied to a fringe field switching (FFS) liquid-crystal display panel, the method further includes forming a protection layer 180 and a second electrode 190 on the pixel structure 10a in FIG. 5A and FIG. 5B of this embodiment, referring to FIG. 6A and FIG. 6B (that is, a pixel structure 10a'). Specifically, the protection layer 180 covers the source electrode S, the drain electrode D, and the first electrode 170, and the second electrode 190 is formed on the protection layer 180. Therefore, in this embodiment, the first electrode 170 is a pixel electrode and the second electrode 190 is a common electrode. The first electrode 170 is coupled to the second electrode 190 to form a storage capacitor (not shown). The material of the protection layer 180 includes an inorganic material (for example, silicon oxide, silicon nitride, silicon oxynitride, other suitable materials, or a stack layer of at least two of the above materials), an organic material, other suitable materials, or a combination of the above. The second electrode 190 may be a transmissive electrode, a reflective electrode, or a semi-transmissive and semi-reflective electrode. The material of the transmissive electrode includes a metallic oxide, for example, indium-tin oxide, indium-zinc oxide, aluminum-tin oxide, aluminum-zinc oxide, indium-germanium-zinc oxide, other suitable oxides, or a stack layer of at least two of the above oxides. The material of the reflective electrode includes a metallic material having a high reflectance.

In perspective of the structure, first referring to FIG. 5A and FIG. 5B, in this embodiment, the pixel structure 10a includes a scan line SL, a data line DL, a gate electrode 120, an insulation layer 130, a gate insulation layer 140, a channel layer 150, a first ohmic contact layer 161, a second ohmic contact layer 162, a source electrode S, a drain electrode D, and a first electrode 170. The scan line SL and the data line DL are disposed on the substrate 110 in an interlaced manner. The gate electrode 120 is located on the substrate 110 and is electrically connected to the scan line SL. The insulation layer 130 is located on the electrode 120 and is provided with an opening O disposed opposite to the gate electrode 120. The gate insulation layer 140 covers the gate electrode 120 and the scan line SL, and the gate insulation layer 140 is located on the insulation layer 130 and accordingly covers the opening O. More specifically, the insulation layer 130 is located between the gate electrode 120 and the gate insulation layer 140, and the gate electrode 120 is exposed out of the opening O of the insulation layer 130. The channel layer 150 is located on the gate insulation layer 140, and the channel layer 150 is located in the opening O. The first ohmic contact layer 161 and the second ohmic contact layer 162 are located on the channel layer 150 and are disposed in the opening O. The source electrode S is located on the first ohmic contact layer 161, where the source electrode S is electrically connected to the data line DL. The drain electrode D is located on the second ohmic contact layer 162, where the drain electrode D is electrically connected to the first electrode 170. In other words, the first ohmic contact layer 161 is located between the channel layer 150 and the source electrode S, the second ohmic contact layer 162 is located between the channel layer 150 and the drain electrode D, and the source electrode S and drain electrode D overlap with the opening O and are located in the opening O. The first electrode 170 is located on the gate insulation layer 140, and is not disposed in the opening O. The gate insulation layer 140 is located between the insulation layer 130 and the source electrode S, drain electrode D, and first electrode 170. In this embodiment, the gate electrode 120, the gate insulation layer 140, the first ohmic contact layer 161, and the second ohmic contact layer 162 each are in a single-layer structure, but the present invention is not limited herein. In other embodiments, the gate electrode 120, the gate insulation layer 140, the first ohmic contact layer 161, and the second ohmic contact layer 162 each may also be in a dual-layer structure or a multi-layer structure. In addition, the extension direction of the scan line SL is different from that of the data line DL. Preferably, the extension direction of the scan line SL is perpendicular to that of the data line DL. The scan line SL and the data line DL are separately in different films and are electrically insulated from each other, and the scan line SL and the data line DL are mainly used to transmit driving signals for driving the pixel structure.

When the pixel structure of the present invention is applied to an FFS liquid-crystal display panel, the pixel structure 10a shown in FIG. 5A and FIG. 5B further includes a protection layer 180 and a second electrode 190, referring to FIG. 6A and FIG. 6B (that is, a pixel structure 10a'). Specifically, the protection layer 180 covers the source electrode, the drain electrode D, and the first electrode 170, and the second electrode 190 is formed on the protection layer 180. The first electrode 170 is a pixel electrode and the second electrode 190 is a common electrode.

In addition, the pixel structure of this embodiment may further include a common electrode line (not shown). The common electrode line may be configured in a film the same as the scan line SL and close to the scan line SL, for example. The extension direction of the common electrode line may be, for example, the same as that of the scan line SL and different from that of the data line DL, and the common electrode line is coupled to the first electrode 170 to form a storage capacitor (not shown), but the present invention is not limited herein. When the pixel structure of the present invention is applied to an FFS liquid-crystal display panel, the common electrode line is electrically connected to the second electrode 190, to reduce an overall resistance value of the second electrode 190.

On the basis of the above, the distance from a gate electrode 120 to the source electrode S and the drain electrode D can be adjusted by means of the configuration of the insulation layer 130 in the pixel structure 10a or 10a' of this embodiment, so that the gate electrode 120 is spaced from the source electrode S and from the drain electrode D at a relative large distance. Because the capacity of a capacitance is in a positive proportion to the distance, the parasitic capacitance Cgs between the source electrode S as well as the data line DL electrically connected to the source electrode S and the gate electrode 120 and the parasitic capacitance Cgd between the drain electrode D as well as the first electrode 170 electrically connected to the drain electrode D and the gate electrode 120 both decrease when the distance increases. Therefore, in this embodiment, in addition to reducing the number of photomasks used and avoiding the aligning matter by using the self-align properties, the parasitic capacitance Cgs and Cgd in the pixel structure may also be reduced to further reduce the RC loading and guarantee the display quality of the display.

Figure 7A:
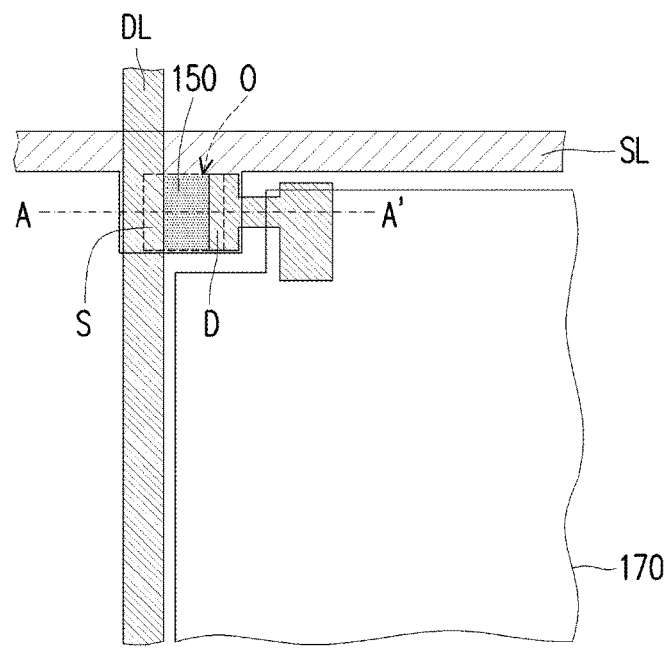
FIG. 7A and FIG. 8A are top views of a process of a fabrication method for a pixel structure according to another embodiment of the present invention.
Figure 7B:
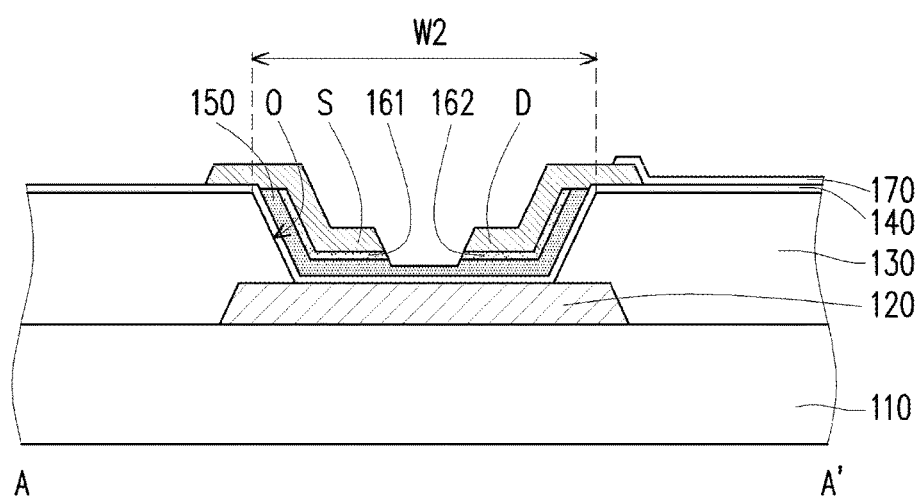
FIG. 7B and FIG. 8B are cross-section diagrams of the process of the fabrication method for a pixel structure in FIG. 7A and FIG. 8A along a section line AA'.
Figure 8A:
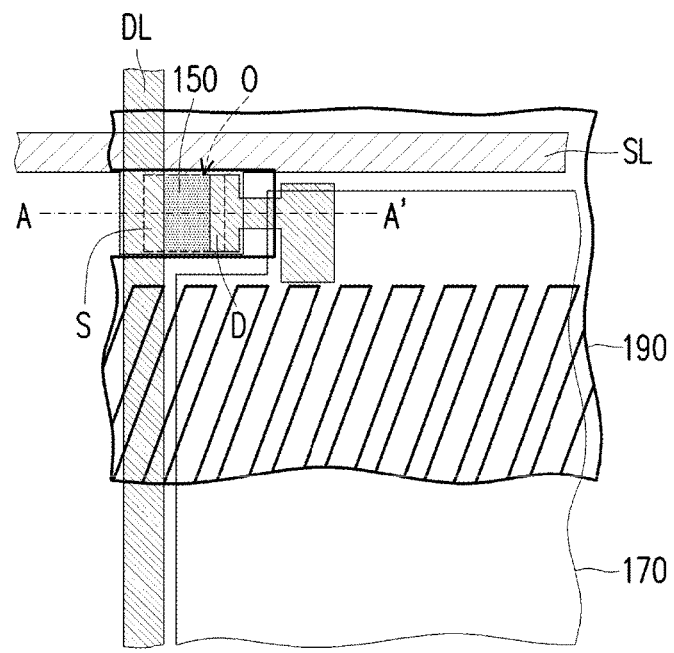
Figure 8B:
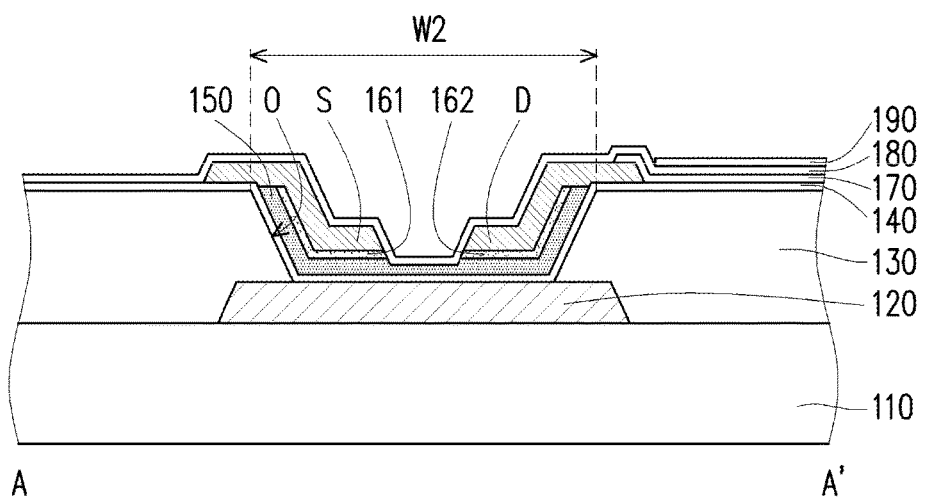

FIG. 7A and FIG. 8A are top views of a process of a fabrication method for a pixel structure according to another embodiment of the present invention. FIG. 7B and FIG. 8B are cross-section diagrams of the process of the fabrication method for a pixel structure in FIG. 7A and FIG. 8A along a section line AA'. The embodiment in FIG. 7A and FIG. 7B is similar to the structure in FIG. 5A and FIG. 5B, and the embodiment in FIG. 8A and FIG. 8B is similar to the structure in FIG. 6A and FIG. 6B. Therefore, the same elements are indicated by using the same symbols, which is not descried again.

Differences between the structure in FIG. 7A and FIG. 7B and the structure in FIG. 5A and FIG. 5B lie in that: the opening O of the pixel structure 10b in FIG. 7A and FIG. 7B has a width W2, where the source electrode S and the drain electrode D extend from the opening O to a surface of the insulation layer 130 far away from the opening O. Specifically, the width W2 of the opening O of the pixel structure 10b in FIG. 7A and FIG. 7B is less than the width W1 of the opening O of the pixel structure 10a in FIG. 5A and FIG. 5B, that is, W2<W1. In this embodiment, the source electrode S and the drain electrode D of the pixel structure 10b in FIG. 7A and FIG. 7B are located partially in the opening O and partially out of the opening O.

Similarly, differences between the structure in FIG. 8A and FIG. 8B and the structure in FIG. 6A and FIG. 6B lie in that: the opening O of the pixel structure 10b' in FIG. 8A and FIG. 8B has a width W2, where the source electrode S and the drain electrode D extend from the opening O to a surface of the insulation layer 130 far away from the opening O. Specifically, the width W2 of the opening O of the pixel structure 10b' in FIG. 8A and FIG. 8B is less than the width W1 of the opening O of the pixel structure 10a in FIG. 6A and FIG. 6B, that is, W2<W1. In this embodiment, the source electrode S and the drain electrode D of the pixel structure 10b' in FIG. 8A and FIG. 8B are located partially in the opening O and partially out of the opening O.

FIG. 9A to FIG. 13A are top views of a process of a fabrication method for a pixel structure according to another embodiment of the present invention. FIG. 9B to FIG. 13B are cross-section diagrams of the process of the fabrication method for a pixel structure in FIG. 9A to FIG. 13A along a section line AA'. The elements in the embodiment in FIG. 9A to FIG. 13B have the same or similar structure and material with the elements in FIG. 1A to FIG. 6B, and therefore the same or similar elements are indicated by using the same symbols, and details of the materials and forming methods are not described again herein, so as to avoid repetition.

Figure 9A:
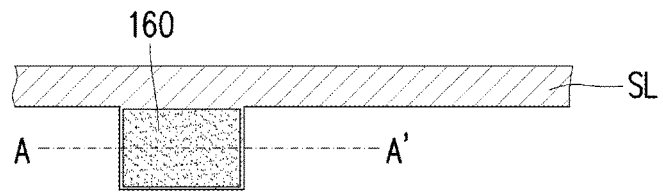
Figure 9B:
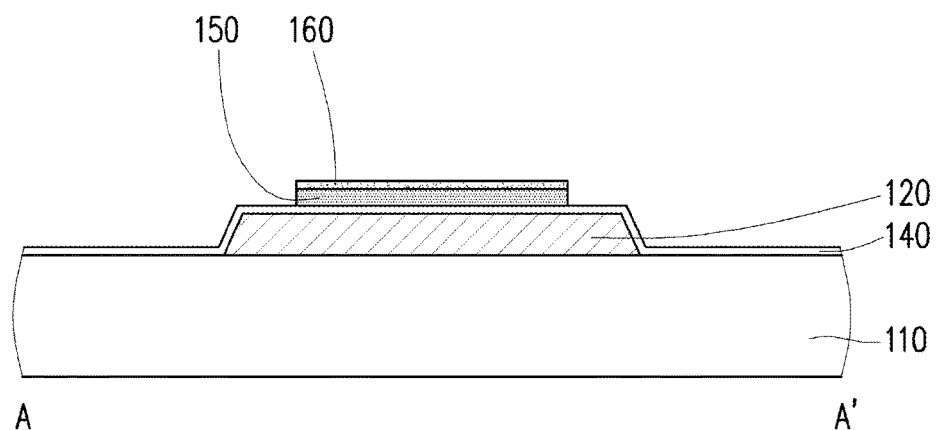

Referring to FIG. 9A and FIG. 9b, a substrate 110 is provided, and a gate electrode 120 and a scan line SL connected to the gate electrode 120 are formed on the substrate 110. Subsequently, a gate insulation layer 140 is formed on the substrate 110, where the gate insulation layer 140 covers the gate electrode 120 and the scan line SL. A channel layer 150 and an ohmic contact layer 160 are sequentially formed on the gate insulation layer 140, where the ohmic contact layer 160 and the channel layer 150 cover a part of the gate electrode 120 and a part of the gate insulation layer 140.

Figure 10A:
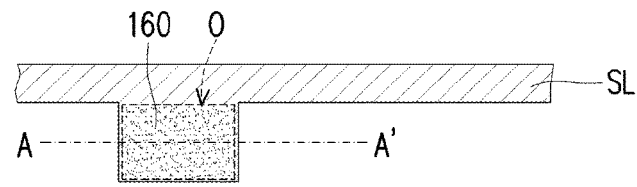
Figure 10B:
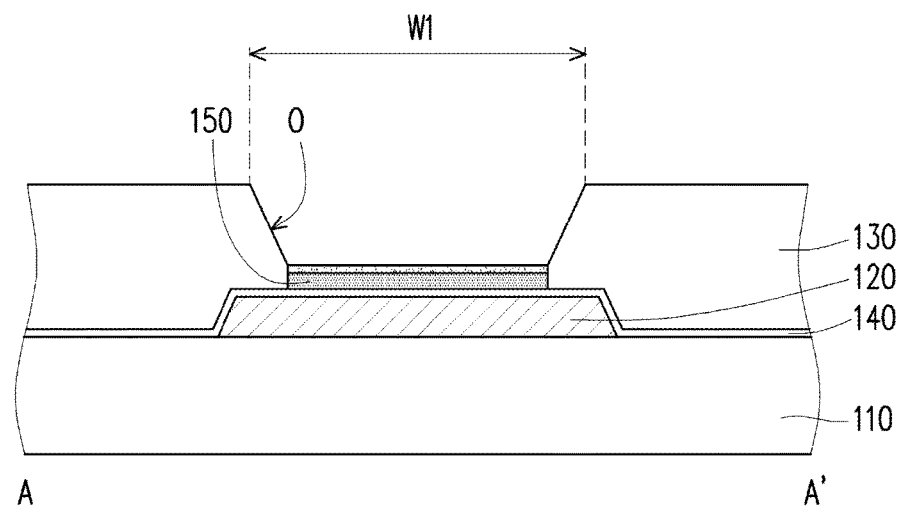

Referring to FIGS. 10A and 10B, an insulation material layer (not shown) is formed on the substrate 110 to cover the gate insulation layer 140, the channel layer 150, and the ohmic contact layer 160. Subsequently, the insulation material layer is patterned to form, on the insulation layer 130, an opening O opposite to the gate electrode 120, where the channel layer 150 and the ohmic contact layer 160 may be fully or partially exposed out of the opening O. The channel layer 150 and the ohmic contact layer 160 in this embodiment are fully exposed out of the opening O. Therefore, the channel layer 150 and the ohmic contact layer 160 are located in the opening O, as shown in FIG. 10B. The opening O has a width W1 along the extension direction of the scan line SL, and W1 is approximately in a range between 5 µm and 15 µm, but the present invention is not limited herein. In this embodiment, the thickness of the insulation layer 130 is approximately in a range between 1 µm and 4 µm, but the present invention is not limited herein. The material of the insulation layer 130 may be, for example, an inorganic material such as polyester (PET), polyalfaolefine, polyacrylamide, polycarbonate, poly(phenyleneoxide), polypropylene, polyether, polyketone, polyol, polyacetal, an organic material such as siloxane, other suitable materials, or a combination above.

Figure 11A:
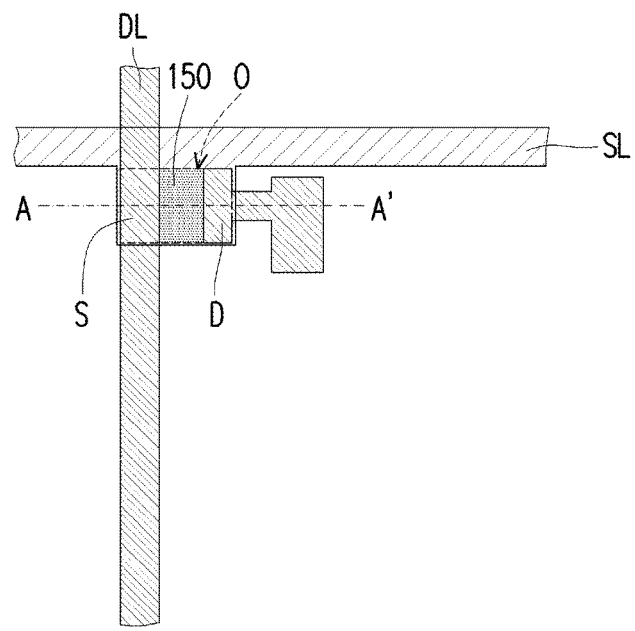
Figure 11B:
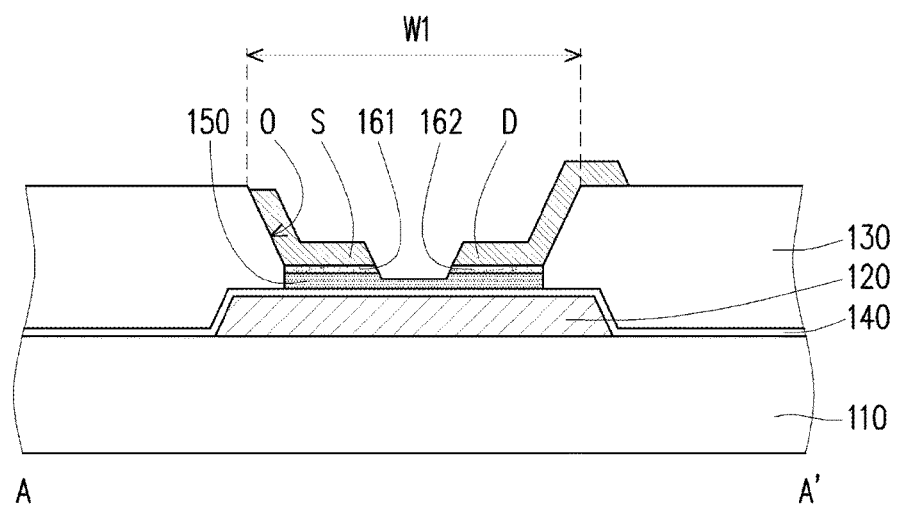

Subsequently, similar to the step in FIG. 4A and FIG. 4B, referring to FIG. 11A and FIG. 11B, during forming of a source electrode S, a drain electrode D, and a data line DL connected to the source electrode S on the substrate 110, an ohmic contact material layer 160 is simultaneously patterned to form first ohmic contact layer 161 in contact with the source electrode S and a second ohmic contact layer 162 in contact with the drain electrode D, and the channel layer 150 is exposed out of both the first ohmic contact layer 161 and the second ohmic contact layer 162. The source electrode S, the drain electrode D, the first ohmic contact layer 161, and the second ohmic contact layer 162 are formed in the opening O, and the channel layer 150 is exposed out of both the first ohmic contact layer 161 and the second ohmic contact layer 162, as shown in FIG. 11A and FIG. 11B. In other words, the first ohmic contact layer 161 and the second ohmic contact layer 162 are formed on the channel layer 150 and located in the opening O, and the source electrode S and the drain electrode D are located on the first ohmic contact layer 161 and the second ohmic contact layer 162, where the source electrode S and a part of the drain electrode D are formed in the opening O, and the data line DL and a part of the drain electrode D are located out of the opening O. That is, the first ohmic contact layer 161 is located between the channel layer 150 and the source electrode S, and the second ohmic contact layer 162 is located between the channel layer 150 and the drain electrode D. Further, in this embodiment, in the patterning step during forming of the source electrode S, the drain electrode D, and the data line DL, in addition to simultaneously patterning the ohmic contact layer 160 to form the first ohmic contact layer 161 and the second ohmic contact layer 162, the channel layer 150 is further patterned to remove a part of the channel layer 150 that is exposed out of the first ohmic contact layer 161 and the second ohmic contact layer 162. In other embodiments, the channel layer 150 may also be exposed but is not patterned when the ohmic contact material layer 160 is patterned to form the first ohmic contact layer 161 and the second ohmic contact layer 162. So far, the thin film transistor 200a of this embodiment is formed.

Figure 12A:
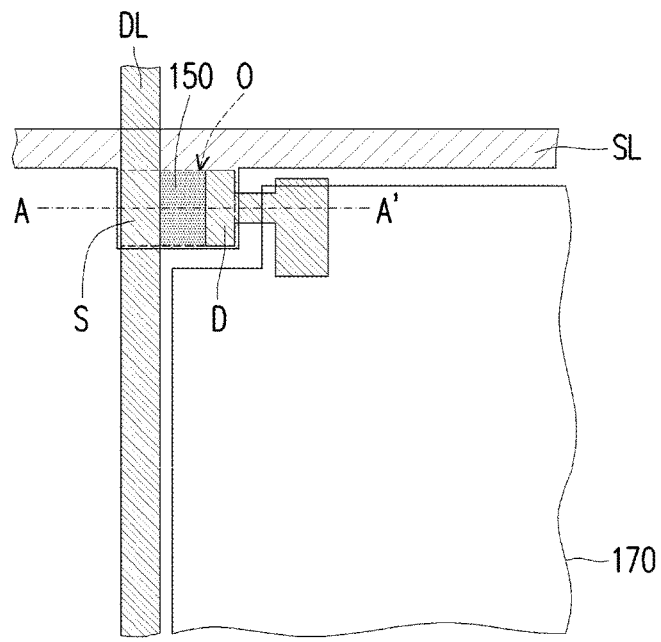
Figure 12B:
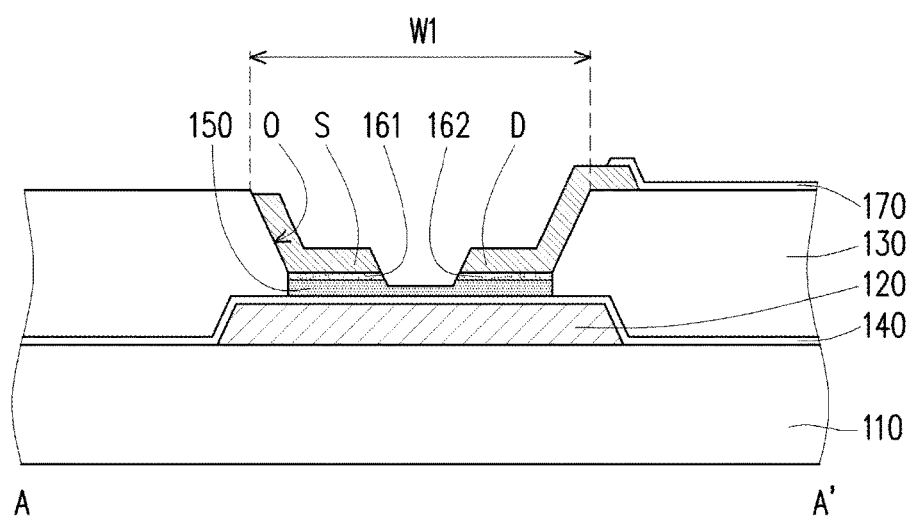

Referring to FIG. 12A and FIG. 12B, a first electrode 170 is formed on the thin film transistor 200a. The first electrode 170 is electrically connected to the drain electrode D. Up to this step, the pixel structure 20a of this embodiment is finished.

Figure 13A:
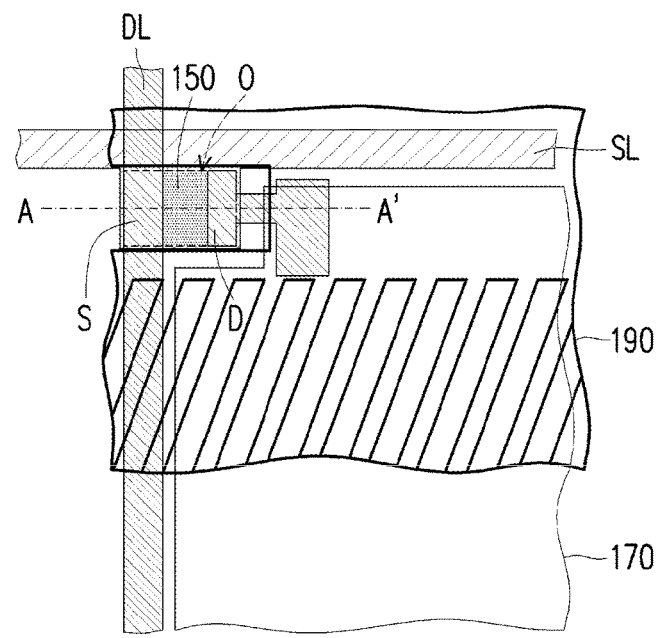
Figure 13B:
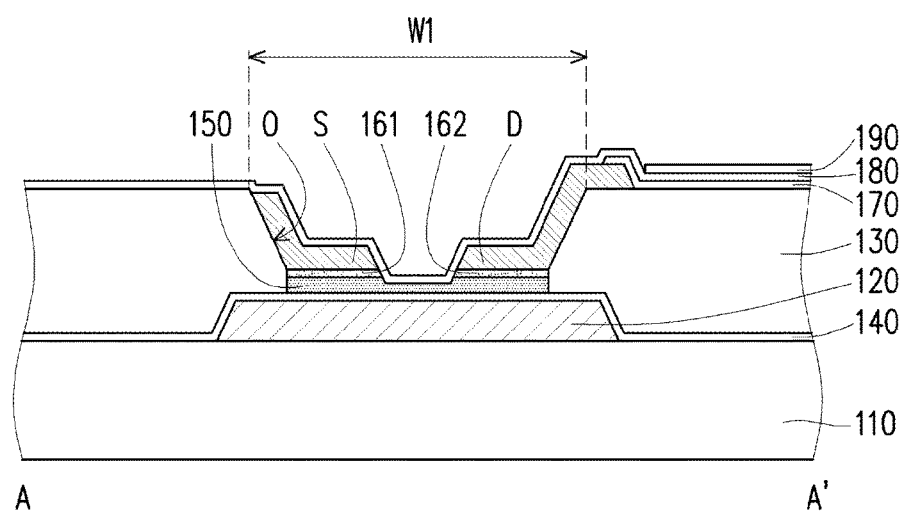

It should be noted that, when the pixel structure of the present invention is applied to an FFS liquid-crystal display panel, the method further includes forming a protection layer 180 and a second electrode 190 on the pixel structure 20a in FIG. 12A and FIG. 12B of this embodiment, referring to FIG. 13A and FIG. 13B (that is, a pixel structure 20a'). Specifically, the protection layer 180 covers the source electrode S, the drain electrode D, and the first electrode 170, and the second electrode 190 is formed on the protection layer 180. Therefore, in this embodiment, the first electrode 170 is a pixel electrode and the second electrode 190 is a common electrode. The first electrode 170 is coupled to the second electrode 190 to form a storage capacitor (not shown).

In perspective of the structure, first referring to FIG. 12A and FIG. 12B, in this embodiment, the pixel structure 20a includes a scan line SL, a data line DL, a gate electrode 120, an insulation layer 130, a gate insulation layer 140, a channel layer 150, a first ohmic contact layer 161, a second ohmic contact layer 162, a source electrode S, a drain electrode D, and a first electrode 170. The scan line SL and the data line DL are disposed on the substrate 110 in an interlaced manner. The gate electrode 120 is located on the substrate 110 and is electrically connected to the scan line SL. The gate insulation layer 140 is located on the gate electrode 120 and covers the gate electrode 120 and the scan line SL. The channel layer 150 is located on the gate insulation layer 140 and covers the gate electrode 120. The first ohmic contact layer 161 and the second ohmic contact layer 162 are located above the channel layer 150. The insulation layer 130 is located above the gate electrode 120 and is provided with an opening O disposed opposite to the gate electrode 120, where the opening O is located on the channel layer 150, the first ohmic contact layer 161, and the second ohmic contact layer 162 and the channel layer 150, the first ohmic contact layer 161, and the second ohmic contact layer 162 are exposed out of the opening, so that the channel layer 150, the first ohmic contact layer 161, and the second ohmic contact layer 162 are located in the opening. More specifically, the gate insulation layer 140 is located between the gate electrode 120 and the insulation layer 130, and the channel layer 150, the first ohmic contact layer 161, and the second ohmic contact layer 162 are located between the insulation layer 130 and the gate insulation layer 140. That is, the insulation layer 130 is located on the gate electrode 120, the gate insulation layer 140, the channel layer 150, the first ohmic contact layer 161, and the second ohmic contact layer 162. The source electrode S is located on the first ohmic contact layer 161, where the source electrode S is electrically connected to the data line DL. The drain electrode D is located on the second ohmic contact layer 162, where the drain electrode D is electrically connected to the first electrode 170. In other words, the first ohmic contact layer 161 is located between the channel layer 150 and the source S, the second ohmic contact layer 162 is located between the channel layer 150 and the drain electrode D, and the source electrode S and drain electrode D overlap with the opening O and are located in the opening O. The first electrode 170 is located on the insulation layer 130, and is not disposed in the opening O. In this embodiment, the gate electrode 120, the gate insulation layer 140, the first ohmic contact layer 161, and the second ohmic contact layer 162 each may be, for example, in a single-layer structure, a dual-layer structure, or a multi-layer structure. In addition, the extension direction of the scan line SL is different from that of the data line DL. Preferably, the extension direction of the scan line SL is perpendicular to that of the data line DL. The scan line SL and the data line DL are separately in different films, and the scan line SL and the data line DL are mainly used to transmit driving signals for driving the pixel structure.

When the pixel structure of the present invention is applied to an FFS liquid-crystal display panel, the pixel structure 20a shown in FIG. 12A and FIG. 12B further includes a protection layer 180 and a second electrode 190, referring to FIG. 13A and FIG. 13B (that is, a pixel structure 20a'). Specifically, the protection layer 180 covers the source electrode S, the drain electrode D, and the first electrode 170, and the second electrode 190 is formed on the protection layer 180. The first electrode 170 is a pixel electrode and the second electrode 190 is a common electrode.

In addition, the pixel structure of this embodiment may further include a common electrode line (not shown). The common electrode line may be configured in a film the same as the scan line SL and close to the scan line SL, for example. The extension direction of the common electrode line may be, for example, the same as that of the scan line SL and different from that of the data line DL, and the common electrode line is coupled to the first electrode 170 to form a storage capacitor (not shown), but the present invention is not limited herein. When the pixel structure of the present invention is applied to an FFS liquid-crystal display panel, the common electrode line is electrically connected to the second electrode 190, to reduce an overall resistance value of the second electrode 190.

On the basis of the above, the distance from a gate G to the source electrode S and the drain electrode D can be adjusted by means of the configuration of the insulation layer 130 in the pixel structure 20a or 20a' of this embodiment, so that the gate electrode 120 is spaced from the source electrode S and from the drain electrode D at a relative large distance. Because the capacity of a capacitance is in a positive proportion to the distance, the parasitic capacitance Cgs between the source electrode S as well as the data line DL electrically connected to the source S electrode and the gate electrode 120 and the parasitic capacitance Cgd between the drain electrode D as well as the first electrode 170 electrically connected to the drain electrode D and the gate electrode 120 both decrease when the distance increases. The parasitic capacitance Cgs and Cgd in the pixel structure may also be reduced to further reduce the RC loading and guarantee the display quality of the display.

Figure 14A:
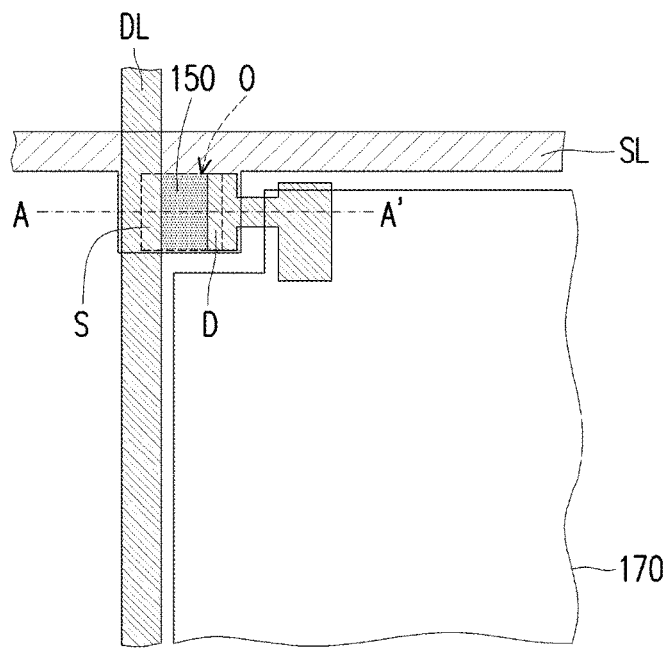
FIG. 14A and FIG. 15A are top views of a process of a fabrication method for a pixel structure according to another embodiment of the present invention.
Figure 14B:
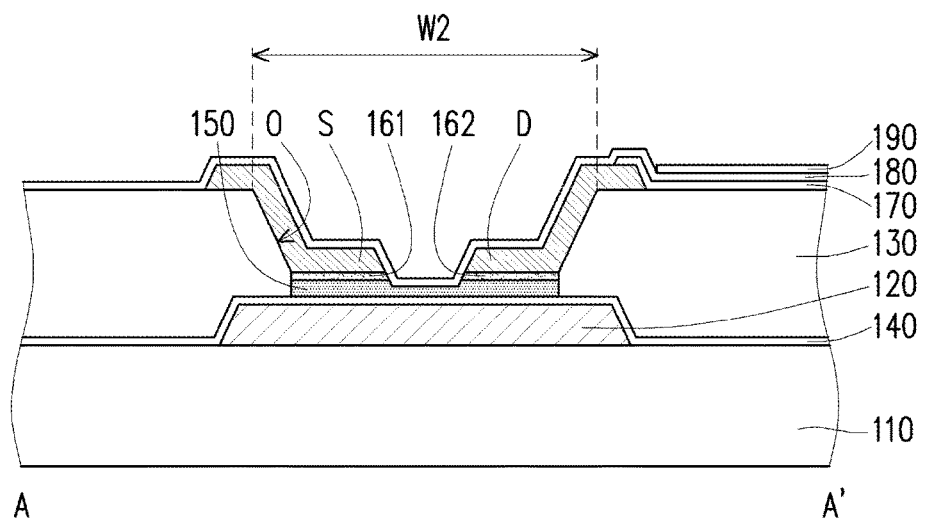
FIG. 14B and FIG. 15B are cross-section diagrams of the process of the fabrication method for a pixel structure in FIG. 14A and FIG. 15A along a section line AA'.
Figure 15A:
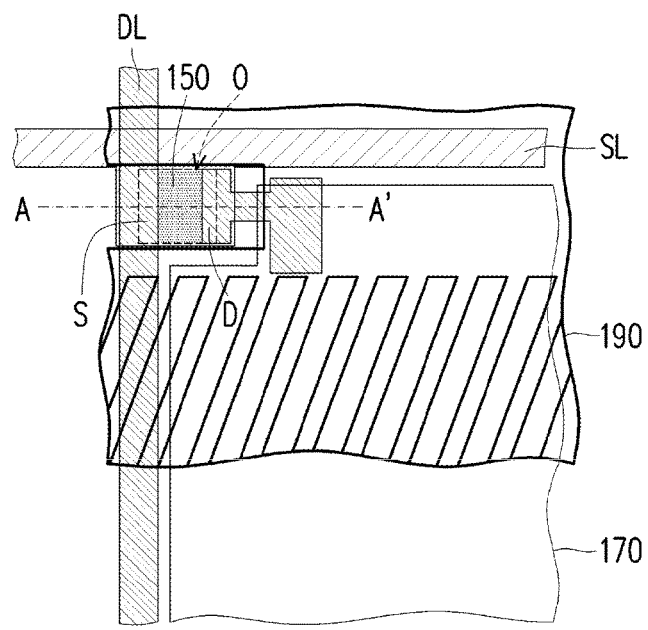
Figure 15B:
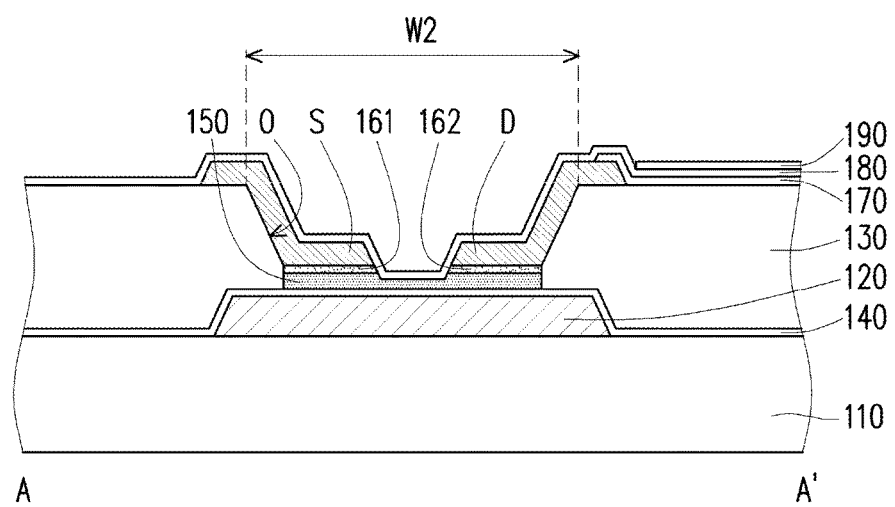

FIG. 14A and FIG. 15A are top views of a process of a fabrication method for a pixel structure according to another embodiment of the present invention. FIG. 14B and FIG. 15B are cross-section diagrams of the process of the fabrication method for a pixel structure in FIG. 14A and FIG. 15A along a section line AA'. The embodiment in FIG. 14A and FIG. 14B is similar to the structure in FIG. 12A and FIG. 12B, and the embodiment in FIG. 15A and FIG. 15B is similar to the structure in FIG. 13A and FIG. 6B. Therefore, the same elements are indicated by using the same symbols, which is not descried again.

Differences between the structure in FIG. 14A and FIG. 14B and the structure in FIG. 12A and FIG. 12B lie in that: the opening O of the pixel structure 20b in FIG. 14A and FIG. 14B has a width W2, where the source electrode S and the drain electrode D extend from the opening O to a surface of the insulation layer 130 far away from the opening O. Specifically, the width W2 of the opening O of the pixel structure 20b in FIG. 14A and FIG. 14B is less than the width W1 of the opening O of the pixel structure 20a in FIG. 12A and FIG. 12B, that is, W2<W1. In this embodiment, the source electrode S and the drain electrode D of the pixel structure 20b in FIG. 14A and FIG. 14B are located partially in the opening O and partially out of the opening O.

Similarly, differences between the structure in FIG. 15A and FIG. 15B and the structure in FIG. 13A and FIG. 13B lie in that: the opening O of the pixel structure 20b' in FIG. 15A and FIG. 15B has a width W2, where the source electrode S and the drain electrode D extend from the opening O to a surface of the insulation layer 130 far away from the opening O. Specifically, the width W2 of the opening O of the pixel structure 20b' in FIG. 15A and FIG. 15B is less than the width W1 of the opening O of the pixel structure 20a' in FIG. 13A and FIG. 13B, that is, W2<W1. In this embodiment, the source electrode S and the drain electrode D of the pixel structure 20b' in FIG. 15A and FIG. 15B are located partially in the opening O and partially out of the opening O.

In addition, as described above, the pixel structure 10a, 10a', 10b, 10b', 20a, 20a', 20b, and 20b' listed in the embodiments of the present invention may further include a common electrode line. To briefly describe the method for manufacturing the pixel structure having a common electrode line, description is provided in the present invention by using a transformation of the pixel structure 10a' shown in FIG. 6A and FIG. 6B as an example, and those skilled in the art may understand that the disclosure may also be applied to a pixel structure in another state in the same or similar method, which is not described again.

Specifically, when the pixel structure of the present invention further includes a common electrode line electrically connected to the second electrode 190, the specific manufacturing steps may be referred to in the description of FIG. 16A to FIG. 22A and FIG. 16B to FIG. 22B below.

FIG. 16A to FIG. 22A are top views of a process of a fabrication method for a pixel structure according to another embodiment of the present invention. FIG. 16B, FIG. 17B, FIG. 18B, FIG. 19B, FIG. 20B, FIG. 21B, and FIG. 22B respectively are cross-section diagrams of the process of the fabrication method for a pixel structure in FIG. 16A to FIG. 22A along a section line AA'. The pixel structures in FIG. 21A and FIG. 21 B and in FIG. 22A and FIG. 22B have the same or similar elements as those of the pixel structure 10a' in FIG. 6A and FIG. 6B. Therefore, the same or similar elements are indicated by using the same or similar element symbols and the materials/manufacturing methods for the elements are not described again.

Figure 16A:
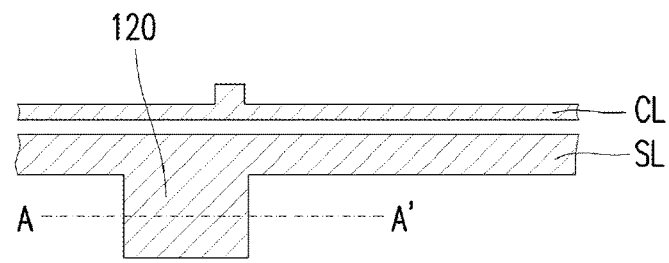
Figure 16B:
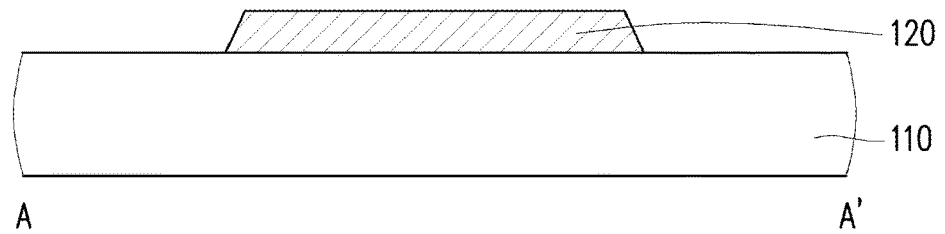
FIG. 16B, FIG. 17B, FIG. 18B, FIG. 19B, FIG. 20B, FIG. 21B, and FIG. 22B respectively are cross-section diagrams of the process of the fabrication method for a pixel structure in FIG. 16A to FIG. 22A along a section line AA'.

Referring to FIG. 16A and FIG. 16B, in this embodiment, a gate electrode 120, a scan line SL connected to the gate electrode 120, and a common electrode line CL are formed on a substrate 110. The common electrode line CL is separately from the gate electrode 120 and the scan line SL. The common electrode line CL is, for example, adjacent to the scan line SL and disposed parallel to the scan line SL. The extension direction of the common electrode line CL is, for example, the same as that of the scan line SL and different from that of the data line DL.

Figure 17A:
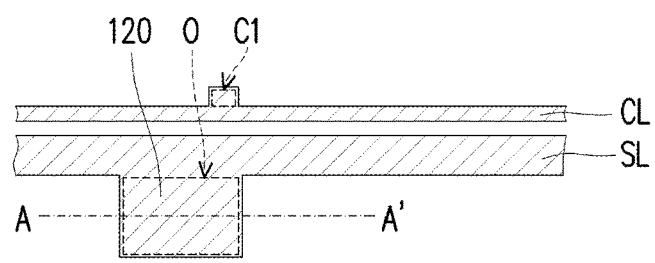
Figure 17B:
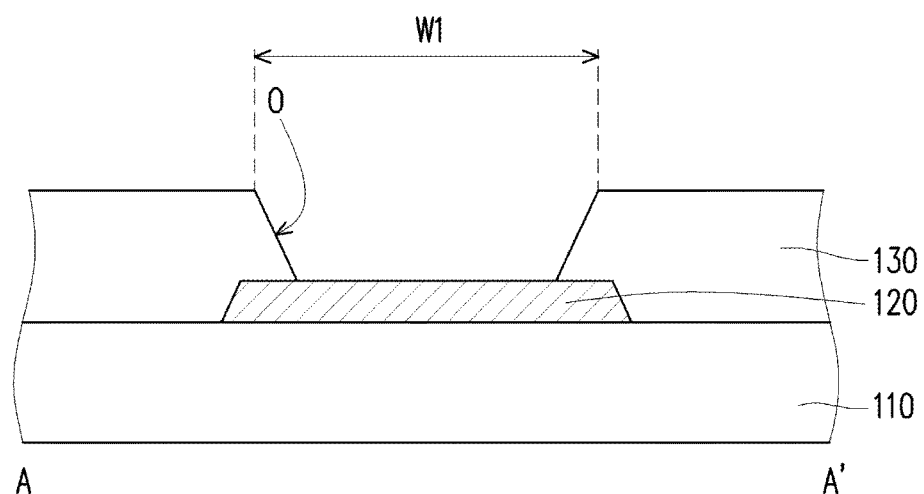

Referring to FIG. 17A and FIG. 17B, an insulation layer 130 is formed on the substrate 110. The thickness of the insulation layer 130 is approximately in a range between 1 µm and 4 µm, but the present invention is limited herein. Subsequently, the insulation layer 130 is patterned to form an opening O to expose the gate electrode 120 and a first contact window C1 to expose the common electrode line CL. The opening O has a width W1 along the extension direction of the scan line SL. The width W1 is approximately in a range between 5 µm and 15 µm, but the present invention is not limited herein.

Figure 18A:
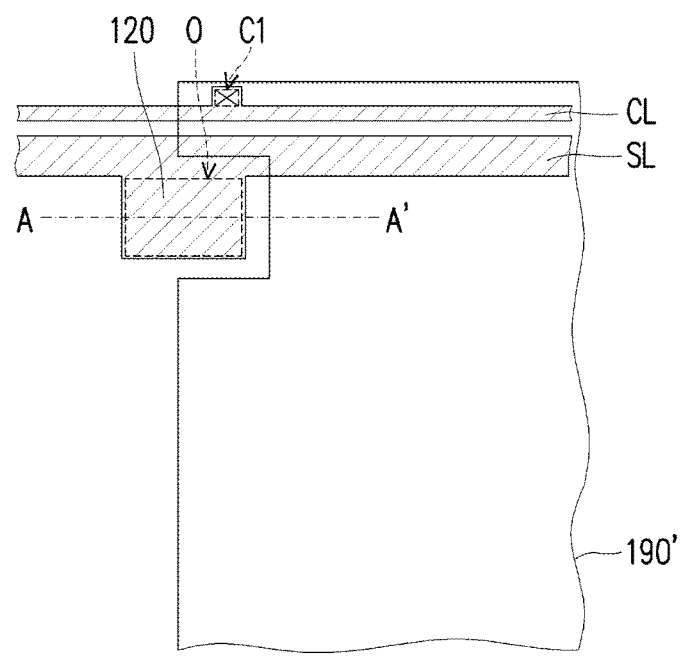
Figure 18B:
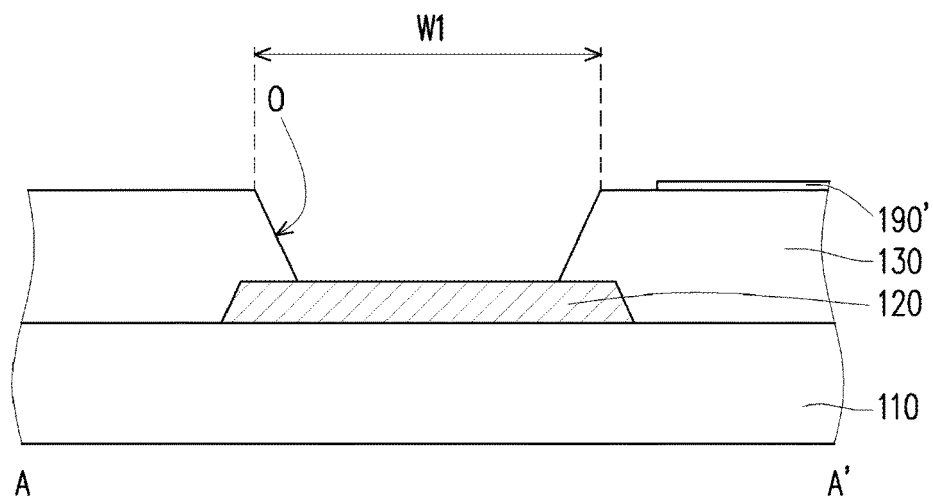

Referring to FIG. 18A and FIG. 18B, a second electrode 190' is formed on the insulation layer 130 and is electrically connected to the common electrode line CL via the first contact window C1. The method for forming the second electrode 190' may include, for example, first forming an electrode material layer (not shown) on the insulation layer 130 and then patterning the electrode material layer to form the second electrode 190', where the electrode material layer is filled in the first contact window C1 to contact the common electrode line CL. In this case, for example, the patterning process is performed through photolithography and etching, but the present invention is not limited herein. The second electrode 190' may be a transmissive electrode, a reflective electrode, or a semi-transmissive and semi-reflective electrode. The material of the transmissive electrode includes a metallic oxide, for example, indium-tin oxide, indium-zinc oxide, aluminum-tin oxide, aluminum-zinc oxide, indium-germanium-zinc oxide, other suitable oxides, or a stack layer of at least two of the above oxides. The material of the reflective electrode includes a metallic material having a high reflectance.

Figure 19A:
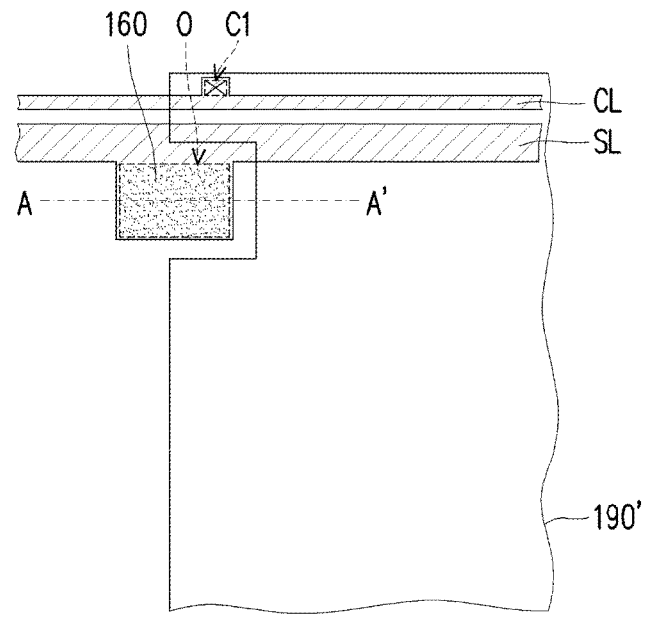
Figure 19B:
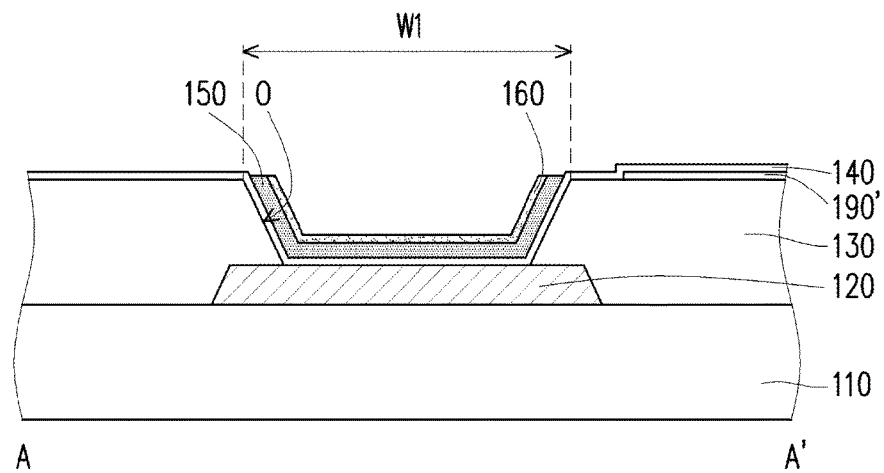

Referring to FIG. 19A and FIG. 19B, a gate insulation layer 140 is formed on the substrate 110 to cover the gate electrode, the scan line SL, the common electrode line CL, the insulation layer 130, the second electrode 190', the first contact window C1, and the opening O. Subsequently, a channel layer 150 and an ohmic contact layer 160 that are located on the opening O are sequentially formed on the gate insulation layer 140, as shown in FIG. 19B. The gate insulation layer 140 covers the common electrode line CL, the second electrode 190', and the first contact window C1. Therefore, the common electrode line CL is electrically insulated from the second electrode 190' at the channel layer 150 and the ohmic contact layer 160, and thus an occurrence of short-circuit phenomenon can be avoided.

Figure 20A:
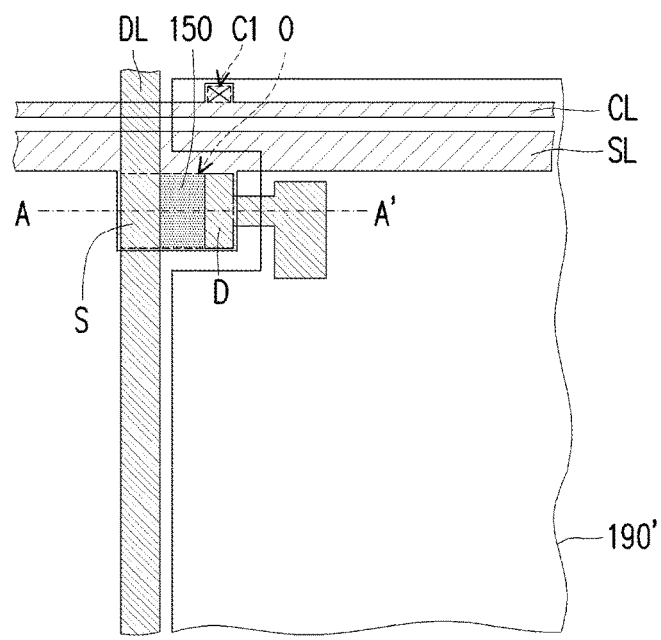
Figure 20B:
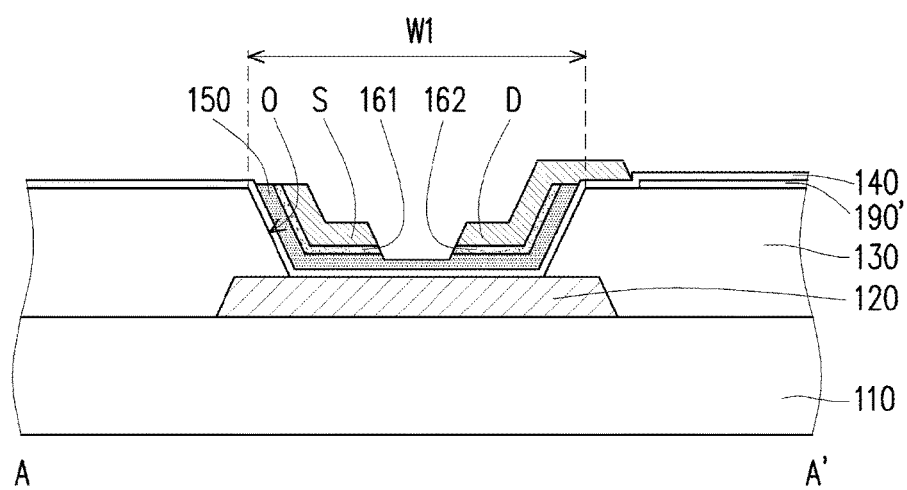

Referring to FIG. 20A and FIG. 20B, a source electrode S, a drain electrode D, and a data line DL connected to the source electrode S are formed on the substrate 110. The source electrode S and a part of the drain electrode D are formed in the opening O. Moreover, in the patterning step during forming of the source electrode S, the drain electrode D, and the data line DL, the ohmic contact layer 160 may be further patterned simultaneously to form a first ohmic contact layer 161 in contact with the source electrode S and a second ohmic contact layer 162 in contact with the drain electrode D, the channel layer 150 is exposed out of both the first ohmic contact layer 161 and the second ohmic contact layer 162, and a part of the channel layer 150 exposed out of the first ohmic contact layer 161 and the second ohmic contact layer 16 is removed, as shown in FIG. 20B. The first ohmic contact layer 161 is located between the channel layer 150 and the source electrode S, and the second ohmic contact layer 162 is located between the channel layer 150 and the drain electrode D. So far, the thin film transistor 100a' of this embodiment is formed.

Figure 21A:
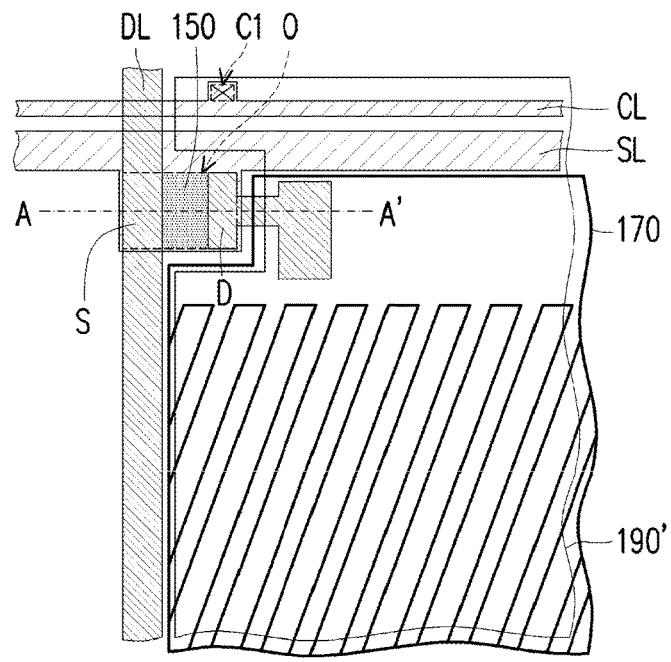
Figure 21B:
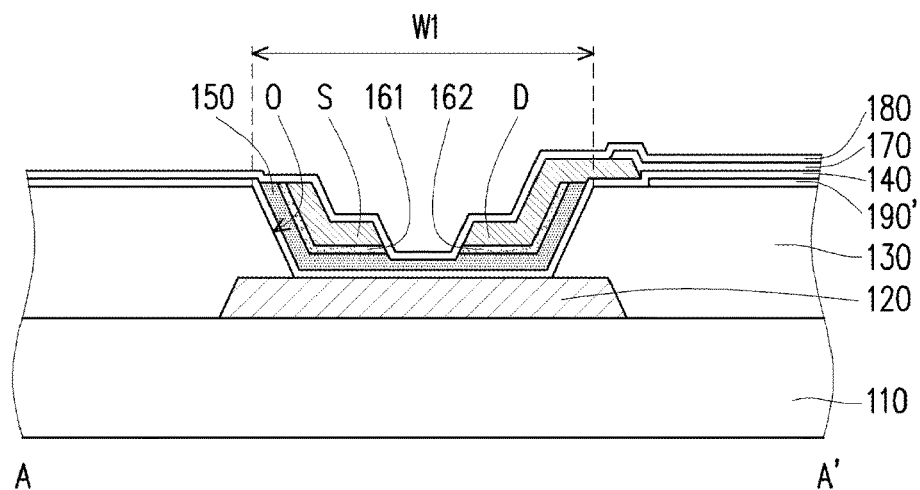

Referring to FIG. 21A and FIG. 21B, a first electrode 170 and a protection layer 180 are sequentially formed on the thin film transistor 100a'. Specifically, the first electrode 170 is electrically connected to the drain electrode D. Subsequently, the protection layer 180 is formed on the first electrode 170, where the protection layer 180 covers the source electrode S, the channel layer 150, the drain electrode D, the first electrode 170, and the second electrode 190'. Up to this step, the pixel structure having the common electrode line CL is finished, but the present invention is not limited herein.

Figure 22A:
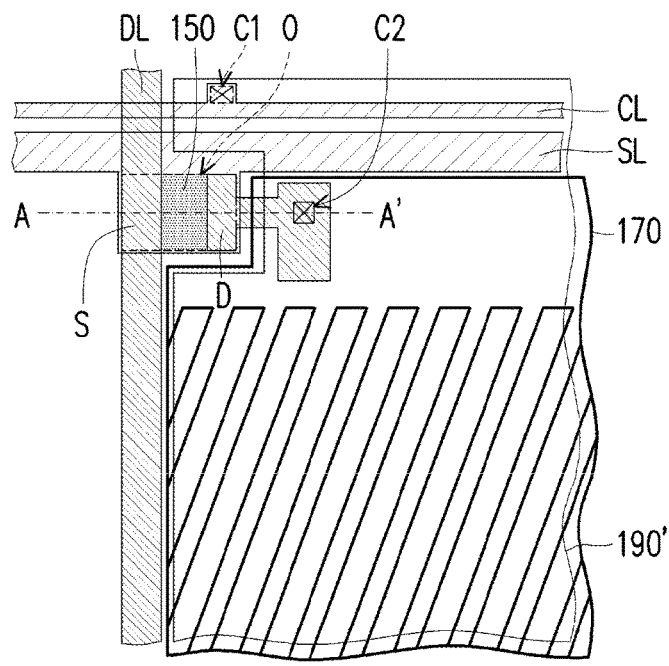
Figure 22B:
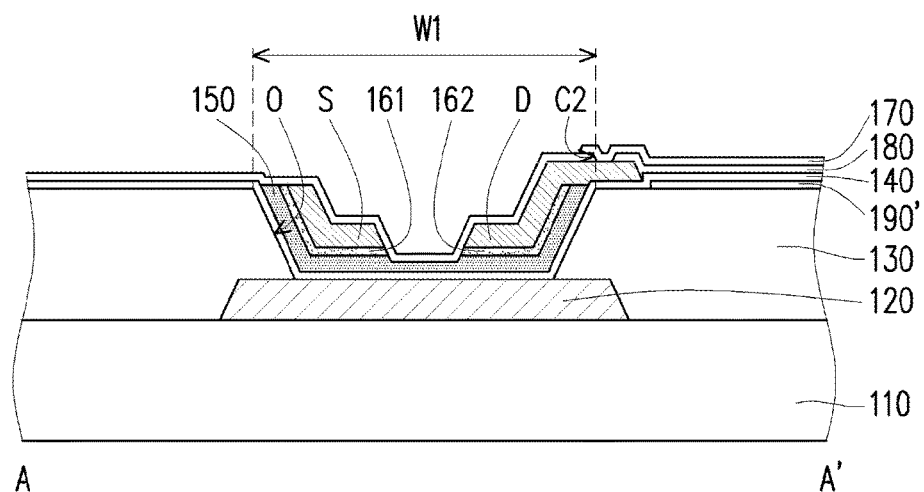

In another embodiment, for example, first the protection layer 180 is formed on the thin film transistor 100a' and then the first electrode 170 is formed, as shown in FIG. 22A and FIG. 22B. Specifically, the protection layer 180 is formed on the thin film transistor 100a' to cover the source electrode S, the channel layer 150, the drain electrode D, and the second electrode 190', and then the protection layer 180 is patterned to form a second contact window C2 to expose the drain electrode D. Subsequently, the first electrode 170 is formed on the protection layer 180, wherein the first electrode 170 contacts the drain electrode D through the second contact window C2, so as to be electrically connected to the drain electrode D. Up to this step, the other pixel structure having the common electrode line CL is also finished.

According to this architecture, the common electrode line CL of the present invention may be electrically connected to the second electrode 190' located in the extension direction of the common electrode line CL, so that an overall resistance value of the second electrode 190' can be reduced.

Apart from this, to prove that the design of the pixel structure of the present invention can actually reduce the parasitic capacitances Cgs and Cgd, tests are provided by particularly using the pixel structure 10a' (FIG. 6A and FIG. 6B) and 10b' (FIG. 8A and FIG. 8B) of the present invention and a conventional pixel structure (that is, there is not an insulation layer 130 between the source/drain and the gate electrode 120). Table 1 below can be referred to.

TABLE 1

| Capacitor type | Pixel structure 10a' | The present invention Pixel structure 10b' | Conventional pixel structure |
|---|---|---|---|
| Cgs (F) | $1.39 \times 10^{-15}$ | $1.36 \times 10^{-15}$ | $8.65 \times 10^{-15}$ |
| Cgd (F) | $2.24 \times 10^{-15}$ | $2.17 \times 10^{-15}$ | $8.27 \times 10^{-15}$ |

From the experimental data in table 1, it can be known that the gate electrode 120 is enabled to be spaced from the source electrode S and the drain electrode D for a relative large distance by disposing the insulation layer 130 between the gate electrode 120 and the source electrode S and between the gate electrode 120 and the drain electrode D. On this basis, Cgs and Cgd of the pixel structures 10a' and 10b' in the embodiments of the present invention are less than Cgs and Cgd of the conventional pixel structure. The RC loading of the pixel structure can be actually reduced, to reduce power consumption, so as to ensure the display quality of a display.

Figure 23:
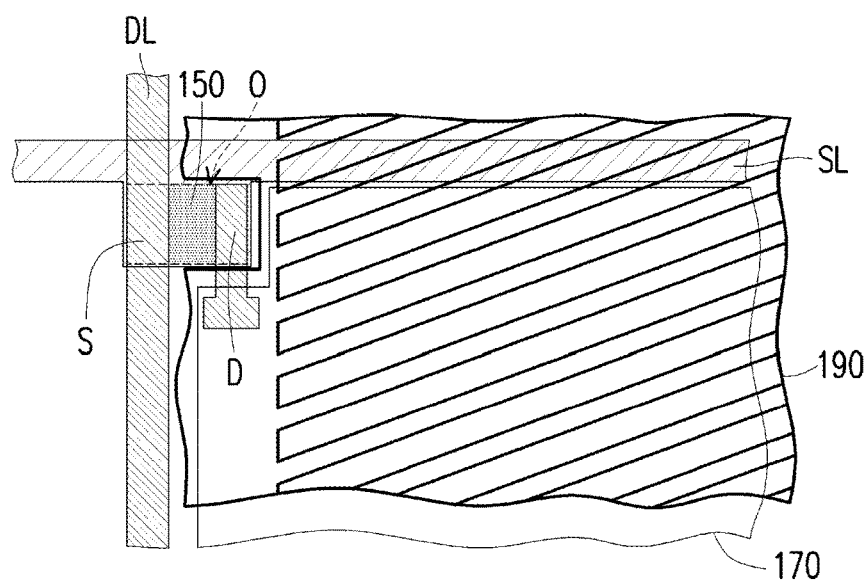
FIG. 23 is a top schematic diagram of a pixel structure according to another embodiment of the present invention.

In addition, Cgs and Cgd of the pixel structure is reduced by providing the insulation layer 130 in the present invention. In the example in which the pixel structure is applied to an FFS liquid-crystal display panel, the source electrode S, the data line DL electrically connected to the source electrode S, and the second electrode 190 (serving as a common electrode herein) are manufactured after the insulation layer 130. Therefore, a parasitic capacitance Csc between the source electrode S as well as the data line DL electrically connected to the source electrode S and the second electrode 190 is greater that a parasitic capacitance Cgc between the gate electrode 120 and the second electrode 190. To resolve this problem, simple changes can be made to the pixel structure of the present invention, and the first electrode 170 and the second electrode 190 can be reoriented. Specifically, the long edges of the first electrode 170 and the second electrode 190 are reoriented from a position parallel to the extension direction of the data line DL to a position parallel to the extension direction of the can line SL, as shown in FIG. 23. Optionally, a part of the second electrode 190 that overlaps with the data line DL is further removed. In this way, the overlapped area between the second electrode 190 and the data line DL decreases to a large extent, and thus a sum of the parasitic capacitance Csc and the parasitic capacitance Cgc can be effectively reduced. Moreover, because there are relatively large distances between the scan line SL and the first electrode 170 and between the scan line SL and the second electrode 190 (that is, the configuration of the insulation layer 130), there are still relatively small parasitic capacitances between the scan line SL and the first electrode 170 and between the scan line SL and the second electrode 190.

TABLE 2

| Capacitor type | Pixel structure 10a' of the present invention | Pixel structure 10b' of the present invention | Pixel structure 10a' of the present invention after reorientation |
|---|---|---|---|
| Cgc (F) | 2.92 × 10⁻¹⁵ | 2.62 × 10⁻¹⁵ | 6.37 × 10⁻¹⁵ |
| Csc (F) | 9.67 × 10⁻¹⁴ | 5.17 × 10⁻¹⁴ | 1.09 × 10⁻¹⁵ |

From the experimental data in table 2, it can be known that the coupling effect between the second electrode 190 and the data line DL can be effectively reduced by reorienting long edges of the first electrode 170 and the second electrode 190 from a position parallel to the extension direction of the data line DL to a position parallel to the extension direction of the scan line SL and by further removing a part of the second electrode 190 that overlaps with the data line DL. On this basis, the overall parasitic capacitance of the pixel structure can be obviously reduced.

In view of the above, the pixel structure of the present invention is provided with an insulation layer between the gate and the source and between the gate electrode and the drain electrode, and therefore the distances from the gate to the source and from the gate electrode to the drain electrode are increased, so as to reduce a gate electrode-drain electrode parasitic capacitance Cgd and a gate electrode-source electrode parasitic capacitance Cgs. In this way, the RC loading can be reduced, to reduce power consumption, so as to ensure the display quality of a display. In an embodiment of the present invention, the precision of the patterning process can be guaranteed by means of configuration of a concave profile of the opening on the insulation layer and using self-align properties in the pixel structure of the present invention, to further reduce costs of a photomask process, effectively increase the manufacturing qualified rate, and reduce the fabrication costs.

Besides, simple changes may be made to the pixel structure of the present invention, and the first electrode and the second electrode are reoriented, so that long edges of the first electrode and second electrode are reoriented from a position parallel to the extension direction of the data line to a position parallel to the extension direction of the scan line, or a part of the second electrode that overlaps with the data line is further removed. In this way, the overlapped area between the second electrode and the data line decreases to a large extent, and thus a sum of parasitic capacitances between the data line and the second electrode can be effectively reduced. Moreover, because there is an insulation layer between the scan line and the first electrode and between the scan line and the second electrode, there are still relatively small parasitic capacitances between the scan line and the first electrode and between the scan line and the second electrode. Therefore, as compared with the conventional pixel electrodes, the present invention provides a pixel electrode and a fabrication method thereof, capable of avoiding the problem of reduction in the display quality of a display caused by phenomena such as a high gate-drain parasitic capacitance and a high gate-source parasitic capacitance.

It will be apparent to those skilled in the art that various modifications and variations can be made by those skilled in the art without departing from the spirit and scope of the present invention, though the present invention is disclosed by using embodiments above. Therefore, the protection scope of the present invention should be subject to the scope defined by the claims of the application below.

What is claimed is:

1. A fabrication method for a pixel structure, comprising:
   forming a gate electrode and a scan line connected to the gate electrode on a substrate;
   forming an insulation layer on the substrate and patterning the insulation layer to form an opening corresponding to the gate electrode;
   forming a gate insulation layer to cover the gate electrode and the scan line;
   forming a channel layer on the gate insulation layer, the channel layer being located in the opening;
   forming a first ohmic contact layer and a second ohmic contact layer on the channel layer, the first ohmic contact layer and the second ohmic contact layer being located in the opening;
   forming a source electrode, a drain electrode, and a data line connected to the source electrode on the first ohmic contact layer and the second ohmic contact layer; and
   forming a first electrode, the first electrode being electrically connected to the drain electrode.

2. The fabrication method for a pixel structure according to claim 1, wherein after the gate electrode is formed, the insulation layer is formed on the gate electrode, the opening is formed in the insulation layer to expose a part of the gate electrode, and then the gate insulation layer is formed to cover the insulation layer and the opening.

3. The fabrication method for a pixel structure according to claim 1, wherein the source electrode and a part of the drain electrode are formed in the opening, and the other part of the drain electrode extends from the opening to a surface of the insulation layer.

4. The fabrication method for a pixel structure according to claim 1, wherein a part of the source electrode and a part of the drain electrode are formed in the opening, and the other part of the source electrode and the other part of the drain electrode extend from the opening to a surface of the insulation layer respectively.

5. The fabrication method for a pixel structure according to claim 1, wherein the step of forming the gate electrode further comprises: forming a common electrode line; and after the gate electrode and the common electrode line are formed, the insulation layer is formed on the gate electrode, the opening is formed in the insulation layer to expose a part of the gate electrode, a first contact window is formed in the insulation layer to expose a part of the common electrode line, and then a second electrode electrically connected to the common electrode line is formed.

6. The fabrication method for a pixel structure according to claim 5, wherein after the second electrode is formed, the gate insulation layer is formed to cover the insulation layer, the opening, the first contact window, and the second electrode, and then the channel layer is formed in the opening.

* * * * *